(12) United States Patent
Yoon et al.

(10) Patent No.: US 11,206,369 B2
(45) Date of Patent: Dec. 21, 2021

(54) IMAGE SENSING DEVICE

(71) Applicant: SK hynix Inc., Icheon-si (KR)

(72) Inventors: Hyung June Yoon, Icheon-si (KR); Jae Won Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/096,423

(22) Filed: Nov. 12, 2020

(65) Prior Publication Data

US 2021/0321056 A1 Oct. 14, 2021

(30) Foreign Application Priority Data

Apr. 9, 2020 (KR) .................. 10-2020-0043303

(51) Int. Cl.

| H04N 5/374 | (2011.01) |
| H04N 5/222 | (2006.01) |
| H04N 5/378 | (2011.01) |
| H04N 5/369 | (2011.01) |
| H04N 5/232 | (2006.01) |
| H01L 27/146 | (2006.01) |
| G01S 17/89 | (2020.01) |

(Continued)

(52) U.S. Cl.
CPC ......... *H04N 5/3745* (2013.01); *H04N 5/3742* (2013.01)

(58) Field of Classification Search
CPC .. H04N 5/3745; H04N 5/3742; H04N 5/2226; H04N 5/232125; H04N 5/36965; H04N 5/369612; H04N 5/378; G06T 7/50; G06T 15/00; G06T 17/00; G01S 17/894; G01S 17/08; H01L 27/14643; H01L 27/14605; H01L 27/14614; H01L 27/14636

USPC ........ 348/302, 308, 294, 297; 257/291, 292, 257/293, 443; 250/208.1, 287; 382/154

See application file for complete search history.

(56) References Cited

U.S. PATENT DOCUMENTS

| 9,601,536 | B2 * | 3/2017 | Johnson | .............. | H01L 27/1463 |
| 10,325,953 | B2 | 6/2019 | Kawahito | | |
| 10,784,306 | B2 * | 9/2020 | Itonaga | ............. | H01L 27/14812 |

(Continued)

*Primary Examiner* — Marly S Camargo
(74) *Attorney, Agent, or Firm* — Perkins Coie LLP

(57) ABSTRACT

The image sensing device includes a pixel array including a plurality of unit pixels arranged in columns and rows. Each unit pixel includes a photoelectric conversion element, circulation gates, transfer gates, and drain nodes. The photoelectric conversion element generates photocharges by performing photoelectric conversion of incident light. The circulation gates are located at sides of the photoelectric conversion element, receive circulation control signals and move the photocharges within the photoelectric conversion element in a predetermined direction based on the circulation control signals. The transfer gates are respectively located between two adjacent circulation gates, receive a transfer control signal and transmit the photocharges to a floating diffusion region based on the transfer control signal. The drain nodes are located at sides of the circulation gates that are opposite to the photoelectric conversion element, and receive a drain voltage. The drain nodes include a first drain node that is shared by two adjacent unit pixels arranged in the first direction and a second drain node that is shared by the two adjacent unit pixels arranged in the second direction.

20 Claims, 17 Drawing Sheets

(51) Int. Cl.
　　　*G01S 17/08*　　　(2006.01)
　　　*H04N 5/3745*　　(2011.01)

(56) References Cited

U.S. PATENT DOCUMENTS

| | | | |
|---|---|---|---|
| 10,854,649 B2* | 12/2020 | Kwag | H01L 27/14609 |
| 10,861,892 B2* | 12/2020 | McGrath | H01L 27/14627 |
| 2011/0073923 A1* | 3/2011 | Tatani | H01L 27/14641 |
| | | | 257/291 |
| 2018/0114809 A1* | 4/2018 | Kawahito | H01L 27/146 |
| 2019/0165018 A1* | 5/2019 | Park | H01L 27/146 |
| 2020/0029047 A1* | 1/2020 | Jin | H04N 5/37452 |
| 2020/0279881 A1* | 9/2020 | Jin | H01L 27/146 |
| 2020/0286938 A1* | 9/2020 | Jin | H01L 27/14607 |
| 2020/0411583 A1* | 12/2020 | Lee | H01L 27/14641 |
| 2021/0183919 A1* | 6/2021 | Kwak | H01L 27/1463 |

\* cited by examiner

IMAGE SENSING DEVICE

CROSS-REFERENCE TO RELATED APPLICATION

This patent document claims the priority and benefits of Korean patent application No. 10-2020-0043303, filed on Apr. 9, 2020, which is incorporated by reference in its entirety as part of the disclosure of this patent document.

TECHNICAL FIELD

The technology and implementations disclosed in this patent document generally relate to an image sensing device.

BACKGROUND

An image sensor is a device for converting an optical image into electrical signals. With the recent development of automotive, medical, computer and communication industries, the demand for high-performance image sensors is increasing in various devices such as digital cameras, camcorders, personal communication systems (PCSs), video game consoles, surveillance cameras, medical micro-cameras, robots, etc.

In order to acquire a three-dimensional (3D) image using the image sensor, color information of the 3D image and the distance (or depth) between a target object and the image sensor are needed.

A method for acquiring information about the distance between the target object and the image sensor may be classified into a passive method and an active method.

The passive method may calculate the distance between the target object and the image sensor using only image information of the target object without emitting light to the target object. The passive method can be applied to a stereo camera.

The active method may be classified into a triangulation method, a Time of Flight (TOF) method, etc. After light has been emitted from a light source (e.g., a laser source) spaced apart from the image sensor by a predetermined distance, the triangulation method may sense light reflected from a target object, and may calculate the distance between the target object and the image sensor using the sensing result. After light has been emitted from the light source to the target object, the TOF method may measure a time duration in which light is reflected from the target object and returns to the image sensor, such that the TOF method may calculate the distance between the target object and the image sensor using the measurement result.

SUMMARY

Various embodiments of the disclosed technology relate to an image sensing device having improved operational characteristics.

In accordance with an embodiment of the disclosed technology, an image sensing device is provided to include a pixel array in which a plurality of unit pixels is arranged in an array shape, wherein each of the plurality of unit pixels includes: a photoelectric conversion element configured to generate photocharges by performing photoelectric conversion of incident light; a plurality of circulation gates located at both sides of the photoelectric conversion element in each of a first direction and a second direction perpendicular to the first direction, and configured to move the photocharges in a predetermined direction within the photoelectric conversion element based on circulation control signals; a plurality of transfer gates respectively located among the circulation gates while being arranged alternately with the circulation gates, and configured to transmit the photocharges moved by the circulation gates to a corresponding floating diffusion (FD) region based on a transfer control signal; and a plurality of drain nodes located at one sides of the circulation gates in a direction opposite to the photoelectric conversion element, and configured to receive a drain voltage, wherein the unit pixels contiguous to each other in the first direction and the other unit pixels contiguous to each other in the second direction are configured to share the drain nodes.

In another aspect, an image sensing device is provided to include a pixel array including a plurality of unit pixels arranged in columns and rows. Each of the plurality of unit pixels may include a photoelectric conversion element configured to perform a photoelectric conversion in response to incident light and generate photocharges corresponding to the incident light, circulation gates located at sides of the photoelectric conversion element and configured to receive circulation control signals and move the photocharges within the photoelectric conversion element in a predetermined direction based on the circulation control signals, transfer gates, each located between two adjacent circulation gates and configured to receive a transfer control signal and transmit the photocharges to a floating diffusion region based on the transfer control signal, and drain nodes located at sides of the circulation gates that are opposite to the photoelectric conversion element, and configured to receive a drain voltage. The drain nodes include a first drain node that is shared by two adjacent unit pixels arranged in a first direction and a second drain node that is shared by the two adjacent unit pixels arranged in a second direction perpendicular to the first direction.

In accordance with another embodiment of the disclosed technology, an image sensing device may include a plurality of photoelectric conversion elements configured to generate photocharges corresponding to incident light through photoelectric conversion of the incident light, and arranged such that the photoelectric conversion elements are spaced apart from one another by a predetermined distance in a first direction and a second direction perpendicular to the first direction, a plurality of common drain nodes located between two adjacent photoelectric conversion elements that are arranged in the first direction or the second direction, a plurality of circulation gates, each located between one of the common drain nodes and one of the photoelectric conversion elements, and a plurality of transfer gates located at corners of each of the photoelectric conversion elements in a third direction and a fourth direction perpendicular to the third direction.

In accordance with still another embodiment of the disclosed technology, an image sensing device may include a light source configured to emit light to a target object, a pixel array including a plurality of unit pixels, each configured to generate a pixel signal by performing photoelectric conversion of incident light reflected from the target object, and a control circuit in communication with the light source and the pixel array and configured to control operations of the light source and the unit pixels and obtain a time delay based on a distance to the target object. In some implementations, the control circuit may control each unit pixel in a manner that electrons move in a clockwise or counterclockwise direction in a photoelectric conversion element and the moved electrons are transmitted to a plurality of floating diffusion (FD) regions, such that the electrons move in opposite directions within contiguous pixels. In some implementations, the control circuit may be further configured to control the unit pixels such that (1) electrons generated in each of the unit pixel move in a clockwise or counterclockwise direction and (2) direction of moves of electrons in two adjacent unit pixel are opposite to each other.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device that can improve operational characteristics of the image sensing device.

Reference will now be made in detail to certain embodiments, examples of which are illustrated in the accompanying drawings. In general, the same reference numbers will be used throughout the drawings to refer to the same or similar parts. In the following description, a detailed description of related known configurations or functions incorporated herein will be omitted to avoid obscuring the subject matter.

Figure 1:
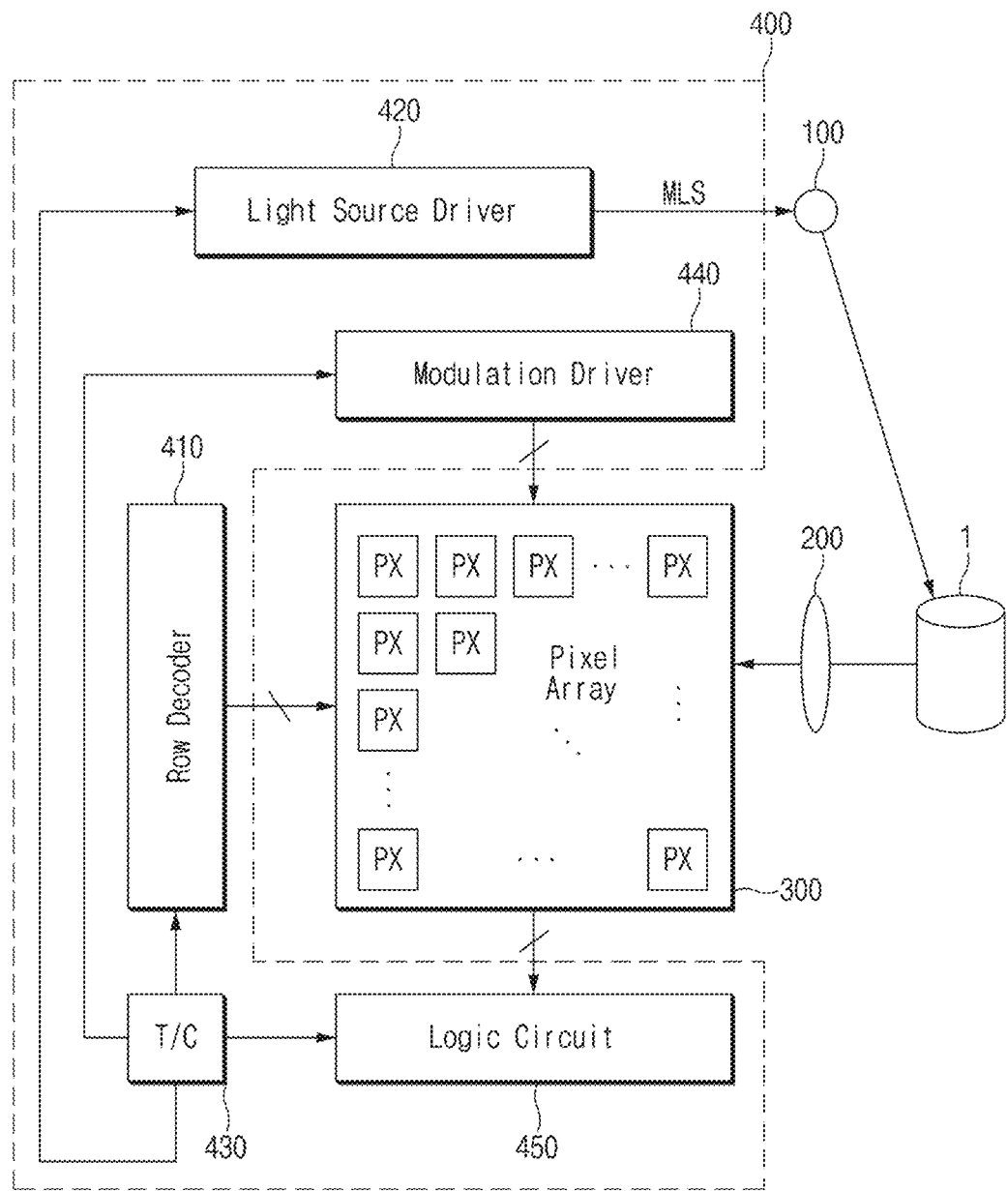
FIG. 1 is a block diagram illustrating an example of an image sensing device based on some implementations of the disclosed technology.

FIG. 1 is a block diagram illustrating an example of an image sensing device based on some implementations of the disclosed technology.

Referring to FIG. 1, the image sensing device may measure the distance using the Time of Flight (TOF) technique. The image sensing device may include a light source 100, a lens module 200, a pixel array 300, and a control circuit 400.

The light source 100 may emit light to a target object 1 upon receiving a clock signal MLS (modulated light signal) from the control circuit 400. The light source 100 may be a laser diode (LD) or a light emitting diode (LED) for emitting infrared light or visible light, or may be any one of a Near Infrared Laser (NIR), a point light source, a monochromatic light source combined with a white lamp or a monochromator, and a combination of other laser sources. For example, the light source 100 may emit infrared light having a wavelength of 800 nm to 1000 nm. Although FIG. 1 shows only one light source 100 for convenience of description, the scope or spirit of the disclosed technology is not limited thereto, and a plurality of light sources may also be arranged in the vicinity of the lens module 200.

The lens module 200 may collect light reflected from the target object 1, and may allow the collected light to be focused onto pixels PXs of the pixel array 300. The lens module 200 may include a focusing lens having a surface formed of or including glass, plastic, or other cylindrical optical elements having a surface formed of or including glass or plastic. The lens module 200 may include a focusing lens having a convex structure.

The pixel array 300 may include unit pixels PXs consecutively arranged in a two-dimensional (2D) structure in which unit pixels PXs are arranged in a column direction and a row direction perpendicular to the column direction. The unit pixels PXs may convert light received through the lens module 200 into an electrical signal corresponding to the received light such that each unit pixel PX can output a pixel signal. In this case, the pixel signal may be a signal for indicating a time delay based on the distance to the target object 1, instead of indicating a signal indicating a color of the target object 1. Some embodiments of the disclosed technology can implement two mechanisms to allow each unit pixel PX to move photocharges (electrons) that generated in a photoelectric conversion element by reflected light in a predetermined direction (i.e., in a clockwise direction or in a counterclockwise direction) and transfer electrons collected by such movement to a plurality of floating diffusion regions. Here, those two mechanisms can be carried out separately from each other. In some implementations, each unit pixel PX may include a plurality of circulation gates and a plurality of transfer gates that are formed to surround the photoelectric conversion element. Such circulation gates and transfer gates are operated such that a certain voltage sequentially applies to the circulation gates and a certain voltage sequentially applies to the transfer gates in a predetermined direction (in a clockwise or counterclockwise direction). Electrons generated in the photoelectric conversion element can move or be transferred in a predetermined direction in response to a potential change in the circulation at the circulation gates and the transfer gates. As described above, the movement of the electrons and the transfer of the electrons are carried out separately from each other, such that a time delay based on the distance to the target object 1 can be more effectively analyzed. In the pixel array 300 in which the unit pixels PXs are consecutively arranged, electrons of the unit pixels located contiguous to each other may move in opposite directions. For example, electrons in any one of the unit pixels may move in a clockwise direction, and electrons in unit pixels that are located contiguous to the corresponding unit pixel in row and column directions may move in a counterclockwise direction. The structure and operations of the unit pixel PX and the pixel array 300 will hereinafter be described.

The control circuit 400 may control the light source 100 so that light can be sent to the target object 1 at the right time. The control circuit 400 may also process each pixel signal corresponding to the light reflected from the target object 1 by operating unit pixels PXs of the pixel array 300, and may measure a time delay based on the distance to the surface of the target object (1).

The control circuit 400 may include a row decoder 410, a light source driver 420, a timing controller (T/C) 430, a modulation driver 440, and a logic circuit 450.

The row decoder 410 may drive unit pixels PXs of the pixel array 300 in response to a timing signal generated from the timing controller 430. For example, the row decoder 410 may generate a control signal capable of selecting at least one of the plurality of row lines. The control signals may include not only a reset signal needed to initialize the unit pixel PX, but also other signals needed to transmit tap signals generated from the floating diffusion (FD) regions of the unit pixel (PX) to the logic circuit 450.

The light source driver 420 may generate a clock signal MLS capable of driving the light source 100 in response to a control signal from the timing controller 430.

The timing controller 430 may generate a timing signal to control the row decoder 410, the light source driver 420, the modulation driver 440, and the logic circuit 450.

The modulation driver 440 may generate control signals for controlling modulation operations of the unit pixels PX based on control signals of the timing controller 430, and may transmit the generated control signals to the pixel array 300. For example, the modulation driver 440 may generate circulation control signals for controlling movement of electrons in the photoelectric conversion element of the unit pixel PX and transfer control signals for sequentially transmitting the electrons to the floating diffusion regions, such that the modulation driver 440 can provide the circulation control signals and the transfer control signals to the pixel array 300.

The logic circuit 450 may process pixel signals received from the pixel array 300 based on timing signals of the timing controller 430, and may thus calculate a time delay based on the distance to the target object 1. The logic circuit 450 may include a correlated double sampler (CDS) circuit for performing correlated double sampling (CDS) on the pixel signals generated from the pixel array 300. In addition, the logic circuit 450 may include an analog-to-digital converter (ADC) for converting output signals of the CDS circuit into digital signals.

Figure 2:
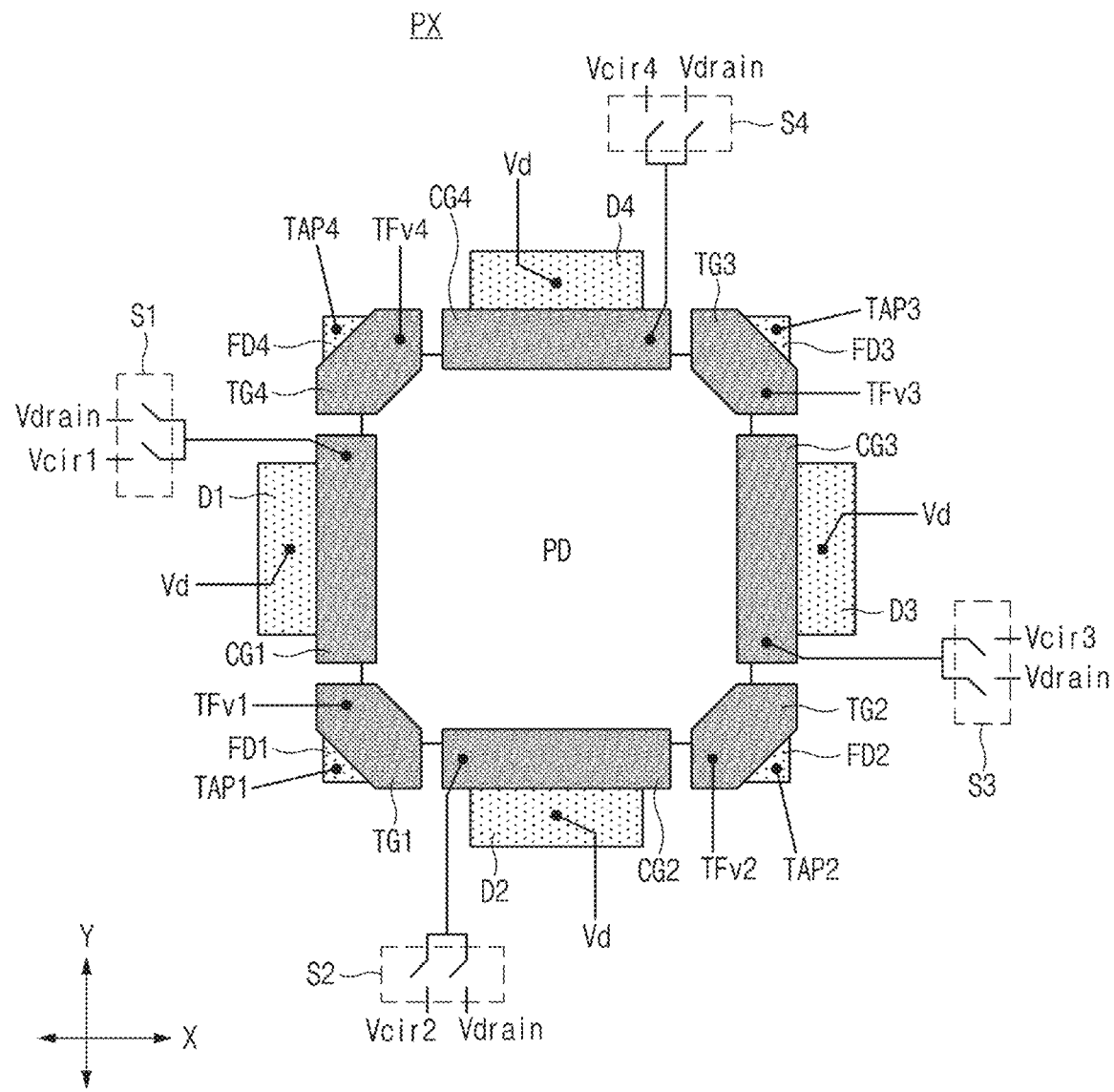
FIG. 2 is a plan view illustrating an example of any one unit pixel formed in a pixel array shown in FIG. 1 based on some implementations of the disclosed technology.

FIG. 2 is a plan view illustrating an example of any one unit pixel PX formed in the pixel array shown in FIG. 1 based on some implementations of the disclosed technology.

Referring to FIG. 2, each unit pixel PX may include a photoelectric conversion element PD, a plurality of floating diffusion regions FD1 to FD4, a plurality of drain nodes D1 to D4, a plurality of transfer gates TG1 to TG4, and a plurality of circulation gates CG1 to CG4.

The photoelectric conversion element PD may be formed in a semiconductor substrate and generate photocharges by performing photoelectric conversion of the reflected light that is incident upon the semiconductor substrate after being reflected from a target object 1. For example, the photoelectric conversion element PD may generate a pair of an electron and a hole in response to such reflected light. The photoelectric conversion element PD may include a stacked structure in which different types of impurity regions are vertically stacked. For example, the photoelectric conversion element may include a photodiode (PD) or a pinned photodiode (PPD) in which an N-type impurity region and a P-type impurity region are vertically stacked.

The floating diffusion regions FD1 to FD4 may be located at one side of the corresponding transfer gates TG1 to TG4, and may store electrons transmitted by the transfer gates TG1 to TG4. Signals corresponding to the amount of charges of electrons stored in the floating diffusion regions FD1 to FD4 may be output as tap signals TAP1 to TAP4, respectively. Each of the tap signals TAP1 to TAP4 may be applied to a gate of a corresponding source follower transistor (not shown) through a conductive line. For example, each of the floating diffusion regions FD1 to FD4 may be coupled to a gate of the corresponding source follower transistor (not shown) through a conductive line. In addition, each of the tap signals TAP1 to TAP4 may be applied to a terminal of the corresponding reset transistor (not shown) through a conductive line. For example, each of the floating diffusion regions FD1 to FD4 may be coupled to the terminal of the corresponding reset transistor (not shown) through a conductive line. Each of the floating diffusion regions FD1 to FD4 may include an impurity region formed by implanting N-type impurities into the semiconductor substrate to a predetermined depth.

The drain nodes D1 to D4 may be located at one side of the corresponding circulation gates CG1 to CG4, respectively, and each of the drain nodes D1 to D4 may be coupled to an input terminal of a drain voltage (Vd) through a conductive line. The drain voltage (Vd) may be at a low-voltage (e.g., a ground voltage) level during a modulation period in which photocharges generated in the photoelectric conversion element PD are collected and then transferred to the floating diffusion regions FD1 to FD4 through the transfer gates TG1 to TG4, and may be at a high-voltage (e.g., a power-supply voltage) level during a read-out period in which electrical signals corresponding to the photocharges stored corresponding floating diffusion regions FD1 to FD4 are read out after the modulation period is ended. Each of the drain nodes D1 to D4 may include an impurity region formed by implanting N-type impurities into the semiconductor substrate to a predetermined depth.

The transfer gates TG1 to TG4 may transfer electrons generated in the photoelectric conversion element PD to the floating diffusion regions FD1 to FD4 based on transfer control signals TFv1 to TFv4. The transfer control signals TFv1 to TFv4 may be received from the modulation driver 440.

The circulation gates CG1 to CG4 may operate in response to circulation control signals Vcir1 to Vcir4 during the modulation period, such that photocharges (electrons) generated in the photoelectric conversion element PD can move in a predetermined direction (e.g., in a counterclockwise direction) in the photoelectric conversion element PD. During the read-out period, the circulation gates CG1 to CG4 may allow the photoelectric conversion element PD to be supplied with a drain voltage (Vd) based on a draining control signal (Vdrain). The circulation control signals Vcir1 to Vcir4 and the draining control signal (Vdrain) may be received from the modulation driver 440.

For example, the circulation gates CG1 to CG4 may be located in corresponding regions at four sides of the photoelectric conversion element PD. For example, the circulation gates CG1 to CG4 are at four sides of the photoelectric conversion element PD when viewed in a plane. The photoelectric conversion element PD has a rectangular shape in a plan view and the circulation gates CG1 to CG4 are at four sides of the rectangular defined by the photoelectric conversion element PD. During the modulation period, the circulation gates CG1 to CG4 may sequentially and consecutively receive the circulation control signals Vcir1 to Vcir4 in a counterclockwise direction, such that the circulation gates CG1 to CG4 can generate an electric field in the edge region of the photoelectric conversion element PD and change the electric field in the corresponding direction at intervals of a predetermined time. Electrons generated by the photoelectric conversion element PD may move in the direction of the electric field generated and changed by the circulation gates CG1 to CG4.

The circulation control signals Vcir1 to Vcir4 may have an electric potential whose level is not sufficient to allow the photoelectric conversion element PD to be electrically coupled to the drain nodes D1 to D4. Thus, during the modulation period, the circulation gates CG1 to CG4 may serve to move electrons generated by the photoelectric conversion element PD.

During the read-out period, the circulation gates CG1 to CG4 may allow the photoelectric conversion element PD to be supplied with the drain voltage (Vd) in response to the draining control signal (Vdrain) to prevent noise from being introduced into the photoelectric conversion element PD and also prevent signal distortion. For example, when the draining control signal (Vdrain) is activated to a logic high level, the circulation gates CG1 to CG4 can electrically couple the photoelectric conversion element PD to the drain nodes D1 to D4. Thus, the activated draining control signal (Vdrain) may have a higher potential than each of the activated circulation control signals Vcir1 to Vcir4.

Therefore, during the read-out period, the draining control signal (Vdrain) may be activated to a high level. In this case, the drain nodes D1 to D4 are electrically coupled to the photoelectric conversion element PD, such that the photoelectric conversion element PD may be coupled to a high drain voltage (Vd). The draining control signal (Vdrain) may be deactivated to a low level during the modulation period.

During the modulation period, the circulation gates CG1 to CG4 may receive the circulation control signals Vcir1 to Vcir4, respectively, in response to the switching operations of the switching elements S1 to S4. During the read-out period, each of the circulation gates CG1 to CG4 may receive the draining control signal (Vdrain) in response to the switching operations of the switching elements S1 to S4.

The transfer gates TG1 to TG4 and the circulation gates CG1 to CG4 may be spaced apart from each other by a predetermined distance while being alternately arranged over the semiconductor substrate. When viewed in a plane, the transfer gates TG1 to TG4 and the circulation gates CG1 to CG4 may be arranged in a ring shape and surround the photoelectric conversion element PD.

The circulation gates CG1 to CG4 may be located over the semiconductor substrate. The circulation gates CG1 and CG3 may be located at both sides of the photoelectric conversion element PD in the first direction, and the circulation gates CG2 and CG4 may be located at both sides of the photoelectric conversion element PD in the second direction perpendicular to the first direction. For example, the circulation gates CG1 to CG4 may be located in the regions corresponding to four sides of the photoelectric conversion element PD, and a portion of each of the circulation gates CG1 to CG4 may overlap with the photoelectric conversion element PD.

Each of the transfer gates TG1 to TG4 can be spaced apart from two contiguous or adjacent circulation gates by a predetermined distance, and can be disposed between the corresponding circulation gates. For example, the transfer gates TG1 to TG4 may be located around corresponding corners of the rectangular defined by the photoelectric conversion element PD, and a portion of each of the transfer gates TG1 to TG4 may overlap with the photoelectric conversion element PD.

Figure 3:
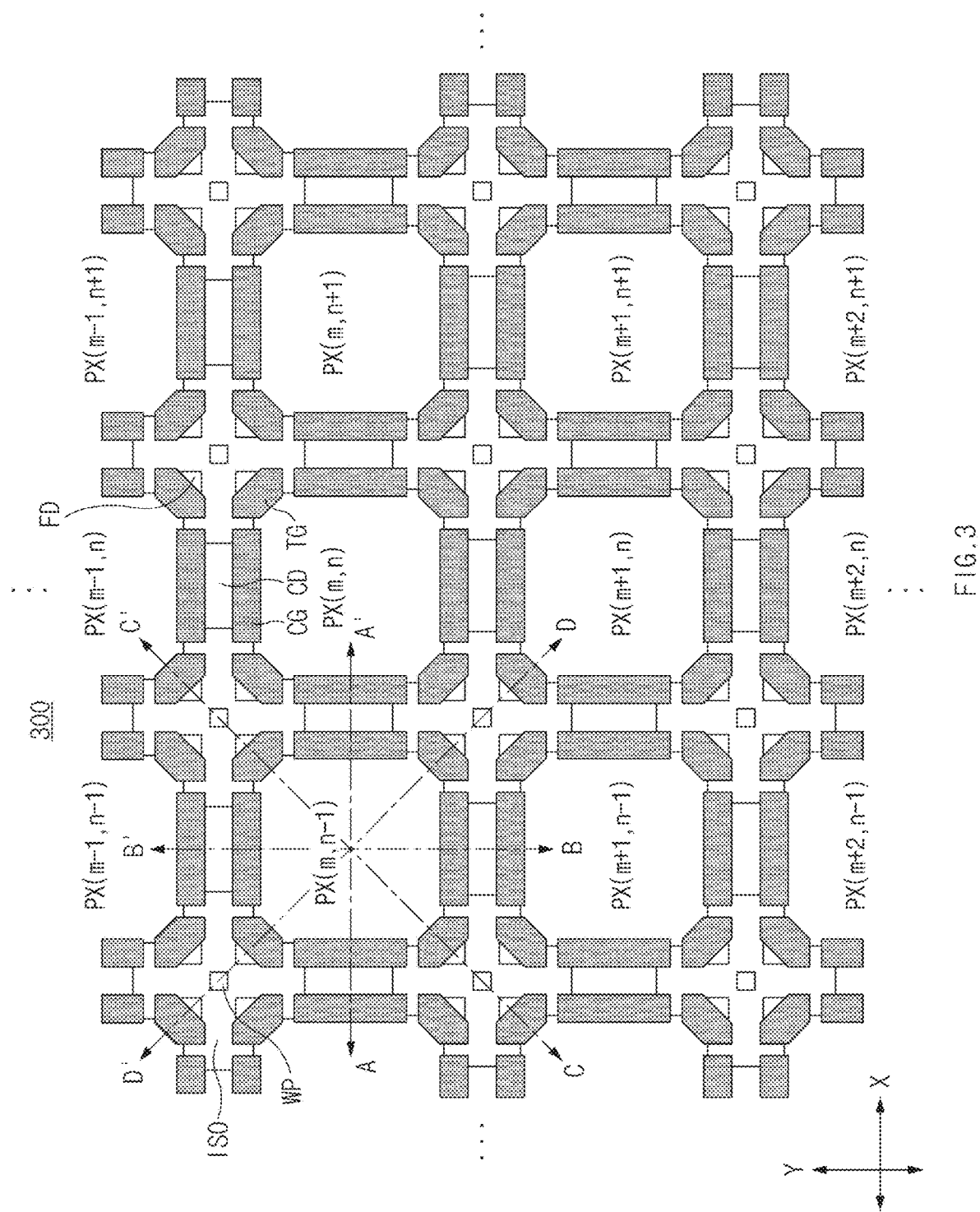
FIG. 3 is a plan view illustrating an example of a pixel array in which unit pixels shown in FIG. 2 are consecutively arranged based on some implementations of the disclosed technology.

FIG. 3 is a plan view illustrating an example of the pixel array 300 in which unit pixels shown in FIG. 2 are consecutively arranged based on some implementations of the disclosed technology.

Referring to FIG. 3, the pixel array 300 may include a plurality of unit pixels {PX(m,n−1), PX(m,n), PX(m,n+1), PX(m+1,n−1), PX(m+1,n), PX(m+1,n+1)} (where each of 'm' and 'n' is a natural number) are consecutively arranged in first and second directions.

Each of the unit pixels {PX(m−1,n−1), PX(m−1,n), PX(m−1,n+1), PX(m,n−1), PX(m,n), PX(m,n+1), PX(m+1, n−1), PX(m+1,n), PX(m+1,n+1)} may have the same structure as in FIG. 2. When the unit pixels {PX(m−1,n−1), PX(m−1,n), PX(m−1,n+1), PX(m,n−1), PX(m,n), PX(m,n+1), PX(m+1,n−1), PX(m+1,n), PX(m+1,n+1)} are consecutively or adjacently arranged in an array shape as shown in FIG. 3, the contiguous or adjacent unit pixels may share their drain nodes.

For example, the unit pixel {PX(m,n)} may share its drain nodes with drain nodes of the unit pixels {PX(m,n−1), PX(m,n+1)} that are contiguous or adjacent to one another in the first direction and drain nodes of the unit pixels {PX(m−1,n), PX(m+1,n)} that are contiguous or adjacent to one another in the second direction. Thus, a common drain node CD contacting the corresponding circulation gates CGs may be located between circulation gates CGs of the unit pixels that are contiguous or adjacent to each other in each of the first and second directions. As described above, the contiguous or adjacent unit pixels may be arranged to share drain nodes thereof, such that the region of the pixel array can be greatly reduced in size as compared to another case in which the contiguous or adjacent unit pixels do not share drain nodes thereof.

A well pickup region WP for applying a bias voltage to a semiconductor substrate may be formed between the unit pixels that are contiguous or adjacent to each other in a third direction (C-C' direction) and a fourth direction (D-D' direction) (e.g., two diagonal directions in the unit pixels formed in a rectangular defined by the photoelectric conversion element PD) located between the first direction and the second direction. For example, the well pickup region WP may be formed between four contiguous or adjacent floating diffusion regions FDs in four unit pixels (i.e., four unit pixels arranged in a (2×2) matrix shape) that are contiguous or adjacent to each other in the first and second directions in a manner that the well pickup region WP can be isolated from the corresponding floating diffusion regions FDs. The well pickup region WP and the floating diffusion regions FDs may be isolated by a device isolation layer ISO formed by burying insulation materials in a trench formed by etching of the semiconductor substrate. The device isolation layer ISO may include a Shallow Trench Isolation (STI) or Deep Trench Isolation (DTI) structure. The well pickup region WP may include an impurity region that is formed by implanting P-type impurities into the semiconductor substrate by a predetermined depth.

Figure 4A:
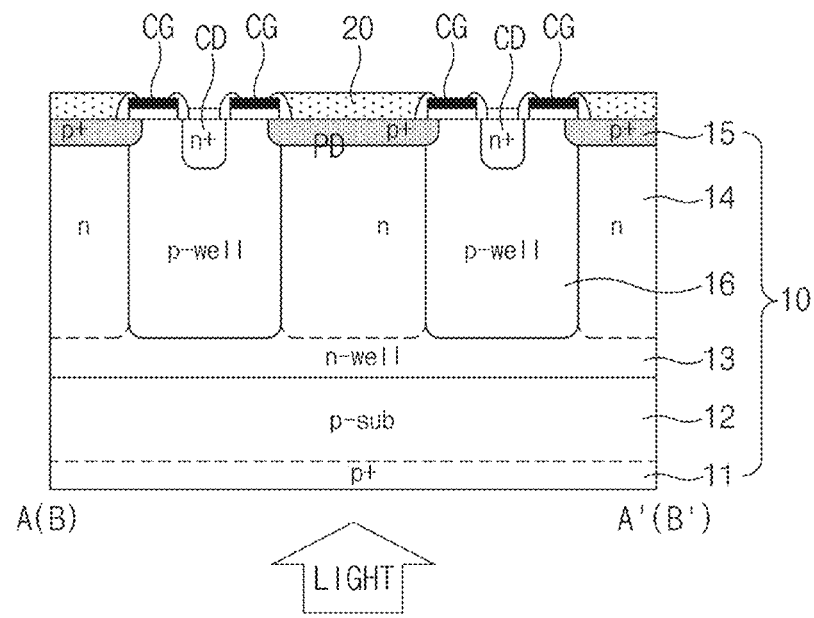
FIG. 4A is a cross-sectional view illustrating an example of a unit pixel taken along the lines A-A' and B-B' shown in FIG. 3 based on some implementations of the disclosed technology.
Figure 4B:
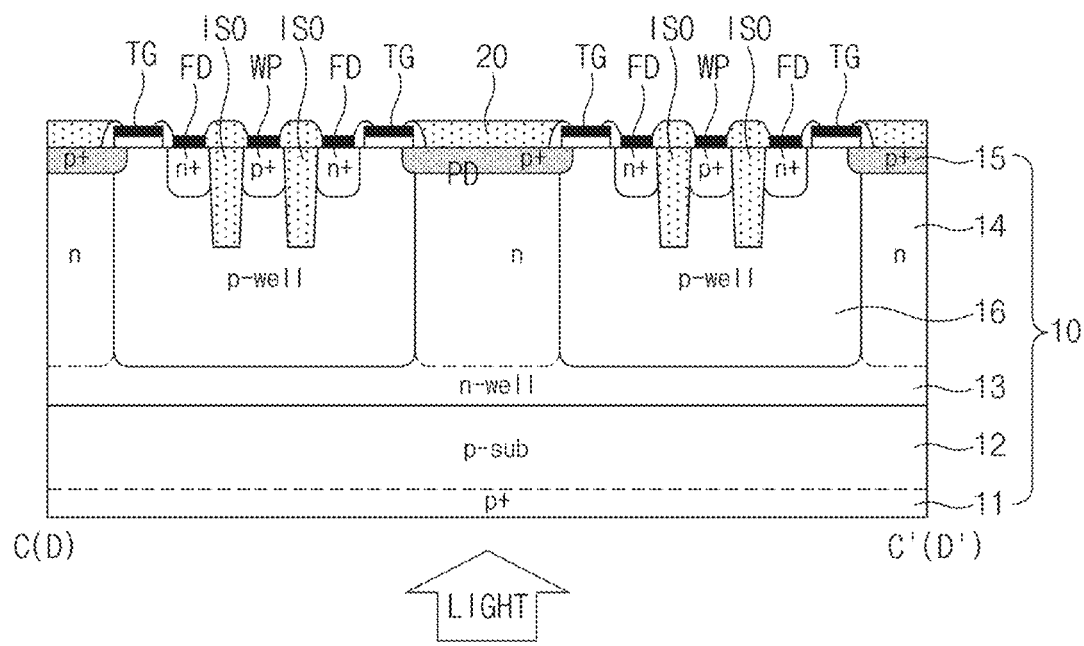
FIG. 4B is a cross-sectional view illustrating an example of a unit pixel taken along the lines C-C' and D-D' shown in FIG. 3 based on some implementations of the disclosed technology.

FIG. 4A is a cross-sectional view illustrating an example of the unit pixel taken along the lines A-A' and B-B' shown in FIG. 3 based on some implementations of the disclosed technology. FIG. 4B is a cross-sectional view illustrating an example of the unit pixel taken along the lines C-C' and D-D' shown in FIG. 3 based on some implementations of the disclosed technology.

Since the cross-sectional view of the unit pixel taken along the line A-A' is identical to the cross-sectional view of the unit pixel taken along the line B-B', the two cross-sectional views are integrated into only one drawing corresponding to FIG. 4A. Since the cross-sectional view of the unit pixel taken along the line C-C' is identical to the cross-sectional view of the unit pixel taken along the line D-D', the two cross-sectional views are integrated into only one drawing corresponding to FIG. 4B.

Referring to FIG. 4A, the semiconductor substrate 10 may include a first surface upon which reflected light is incident and a second surface facing or opposite to the first surface.

The photoelectric conversion element PD may be located at the center part of each unit pixel PX in the semiconductor substrate 10, and may include a stacked structure in which the N-type impurity region 14 and the P-type ($p^+$) impurity region 15 are vertically stacked. The photoelectric conversion element PD may generate photocharges by performing photoelectric conversion of incident light (reflected light) received through the first surface of the semiconductor substrate 10.

A P-well region 16 for device isolation of each photoelectric conversion element PD may be formed between the photoelectric conversion elements PDs that are adjacent to each other in the semiconductor substrate 10. A common drain node CD may be formed in the P-well region 16. In more detail, N-type ($n^+$) impurities may be implanted into the P-well region 16 by a predetermined depth through the second surface, resulting in formation of the common drain node CD. A circulation gate CG may be formed between the photoelectric conversion element PD and the common drain node CD over the second surface.

The N-type impurity region and the P-type impurity region may be sequentially formed below the photoelectric conversion element PD and the P-well region 16. For example, the N-well region 13 may be formed below the photoelectric conversion element PD and the P-well region 16. P-type impurity regions, i.e., a P-sub region 12 and a $P^+$ region 11, may be formed below the N-well region 13.

The insulation layer 20 may be formed over the photoelectric conversion element PD at the second surface of the semiconductor substrate 10.

Referring to FIG. 4B, the P-well region 16 for device isolation of the photoelectric conversion element PD may be formed between the adjacent photoelectric conversion elements PDs in a diagonal direction of the unit pixels. The floating diffusion regions FDs and the well pickup region WP may be formed in the P-well region 16. In more detail, the well pickup region WP and each of the floating diffusion regions FDs may be formed by respectively implanting P-type($p^+$) impurities and N-type ($n^+$) impurities into the P-well region 16 by a predetermined depth through the second surface. The well pickup region WP may be disposed between the floating diffusion regions FDs, and may be isolated from each floating diffusion region FDs by the device isolation layer ISO.

A transfer gate TG may be formed between the photoelectric conversion element PD and the floating diffusion region FD over the second surface.

Figure 5A:
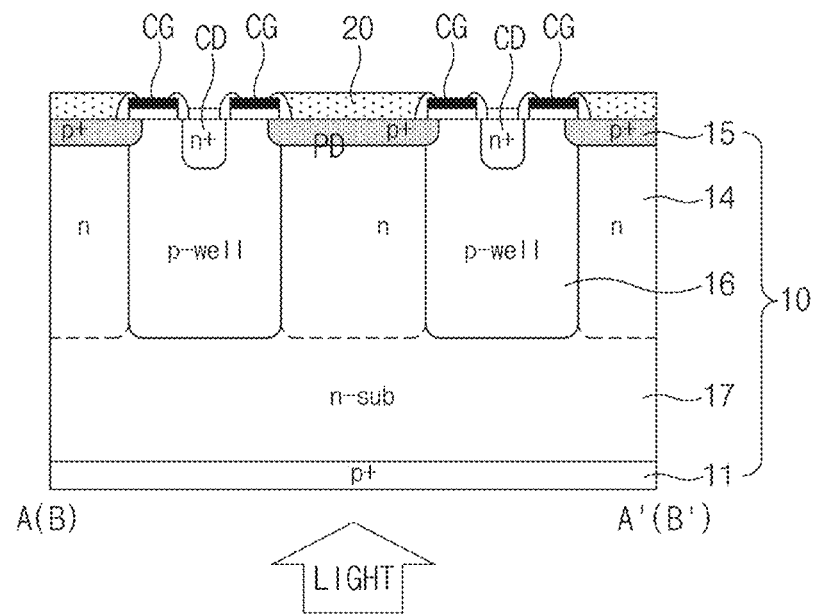
FIG. 5A is a cross-sectional view illustrating an example of a unit pixel taken along the lines A-A' and B-B' shown in FIG. 3 based on some implementations of the disclosed technology.
Figure 5B:
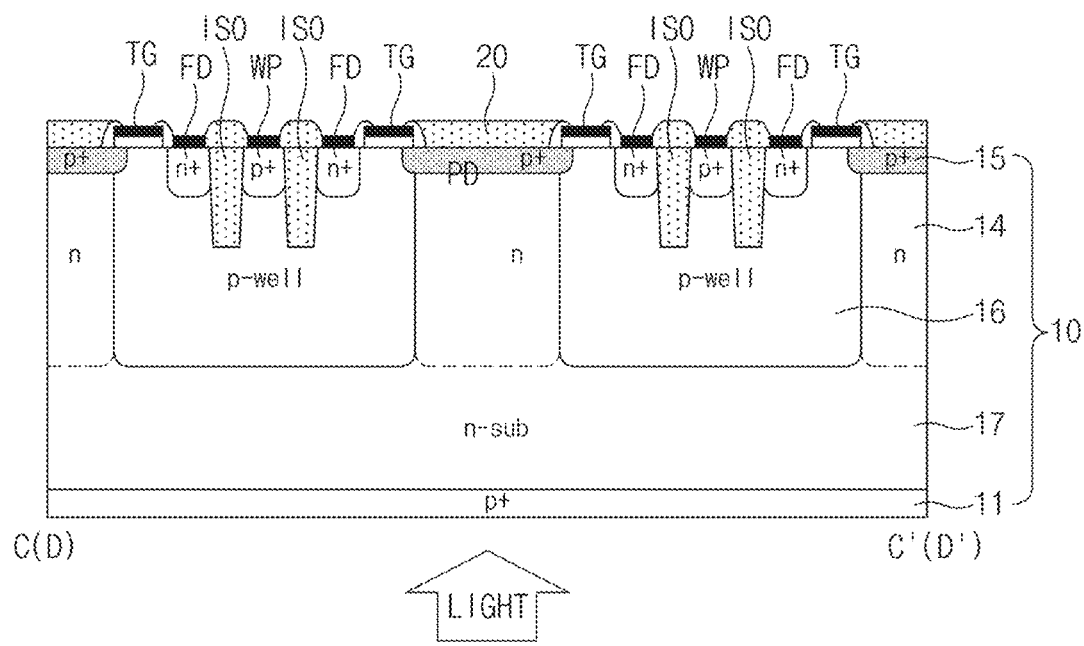
FIG. 5B is a cross-sectional view illustrating an example of a unit pixel taken along the lines C-C' and D-D' shown in FIG. 3 based on some implementations of the disclosed technology.

FIG. 5A is a cross-sectional view illustrating an example of the unit pixel taken along the lines A-A' and B-B' shown in FIG. 3 based on some implementations of the disclosed technology. FIG. 5B is a cross-sectional view illustrating an example of the unit pixel taken along the lines C-C' and D-D' shown in FIG. 3 based on some implementations of the disclosed technology.

In FIGS. 5A and 5B, the same reference numbers will be used for the same or like parts as ones used in FIGS. 4A and 4B.

Referring to FIGS. 5A and 5B, the N-type impurity region and the P-type impurity region may be sequentially formed below the photoelectric conversion element (PD) and the P-well region 16. For example, an N-sub region 17 may be formed below the photoelectric conversion element (PD) and the P-well region 16, and the $P^+$ region 11 may be formed below the N-sub region 17.

N-type impurities and P-type impurities may be additionally implanted into the substrate (P-sub) including P-type impurities, such that the impurity regions shown in FIGS. 4A and 4B may be formed. Alternatively, N-type impurities and P-type impurities may be additionally implanted into the substrate (N-sub) including N-type impurities, such that the impurity regions shown in FIGS. 5A and 5B may be formed.

Figure 6A:
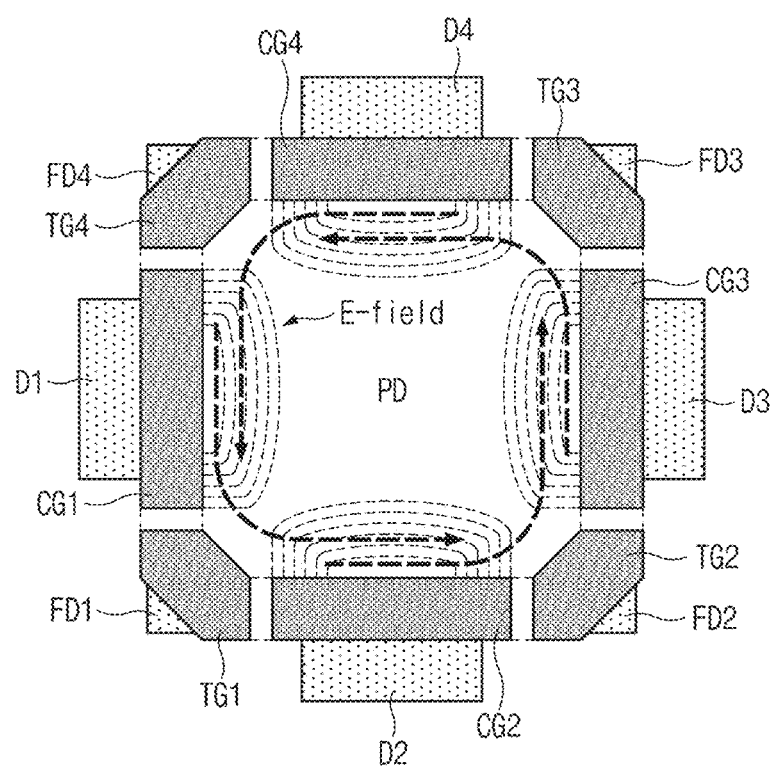
FIG. 6A is a conceptual diagram illustrating an example of the principles in which electrons are circulating by circulation gates in the unit pixel shown in FIG. 2 based on some implementations of the disclosed technology.

FIG. 6A is a conceptual diagram illustrating an example in which electrons are moving by circulation gates in the unit pixel shown in FIG. 2 based on some implementations of the disclosed technology.

Referring to FIG. 6A, when the circulation control signals Vcir1 to Vcir4 are applied to the circulation gates CG1 to CG4, an electric field (E-field) may occur in a peripheral region of the circulation gates CG1 to CG4, such that electrons generated by the photoelectric conversion element PD may be collected around the circulation gates CG1 to CG4 (e.g., an edge region of the photoelectric conversion element PD). In this case, when the magnitude (i.e., potential) of each of the circulation control signals Vcir1 to Vcir4 is less than a predetermined magnitude that allows to form a channel by which the photoelectric conversion element PD is electrically coupled to the drain nodes D1 to D4, electrons may be collected in the peripheral region of the circulation gates CG1 to CG4 without being transferred to the drain nodes D1 to D4.

In a layout structure shown in FIG. 2 in which the circulation gates CG1 to CG4 are arranged to surround an upper portion of the photoelectric conversion element PD, if the circulation control signals Vcir1 to Vcir4 are sequentially and consecutively applied to the circulation gates CG1 to CG4 in a predetermined direction (e.g., in a counterclockwise direction) instead of being applied to the circulation gates CG1 to CG4 at the same time, electrons may move in the edge region of the photoelectric conversion element PD in the order of operations of the circulation gates CG1 to CG4. That is, electrons may move in the edge region of the photoelectric conversion element PD in a predetermined direction.

For example, if the circulation control signal (Vcir1) is applied to the circulation gate CG1, electrons contained in the photoelectric conversion element PD may be collected in the peripheral region of the circulation gate CG1 by the electric field (E-field) formed in the peripheral region of the circulation gate CG1.

After lapse of a predetermined time, if the circulation control signal (Vcir2) is applied to the circulation gate CG2 contiguous or adjacent to the circulation gate CG1, and the circulation control signal (Vcir1) applied to the circulation gate CG1 is then cut off, electrons collected in the peripheral region of the circulation gate CG1 may move to the circulation gate CG2. Thus, electrons may move from the circulation gate CG1 to the circulation gate CG2.

Subsequently, if the circulation control signal (Vcir3) is applied to the circulation gate CG3 contiguous or adjacent to the circulation gate CG2, and the circulation control signal (Vcir2) applied to the circulation gate CG2 is then cut off, electrons collected in the peripheral region of the circulation gate CG2 may move to the circulation gate CG3. Thus, electrons may move from the circulation gate CG2 to the circulation gate CG3.

Subsequently, if the circulation control signal (Vcir4) is applied to the circulation gate CG4 contiguous or adjacent to the circulation gate CG3, and the circulation control signal (Vcir3) applied to the circulation gate CG3 is then cut off, electrons collected in the peripheral region of the circulation gate CG3 may move to the circulation gate CG4. Thus, electrons may move from the circulation gate CG3 to the circulation gate CG4.

Subsequently, if the circulation control signal (Vcir1) is applied to the circulation gate CG1 contiguous or adjacent to the circulation gate CG4, and the circulation control signal (Vcir4) applied to the circulation gate CG4 is then cut off, electrons collected in the peripheral region of the circulation gate CG4 may move to the circulation gate CG1. Thus, electrons may move from the circulation gate CG4 to the circulation gate CG1.

If the above-mentioned operations are repeatedly and consecutively performed, electrons can circulate in the edge region of the photoelectric conversion element PD.

Figure 6B:
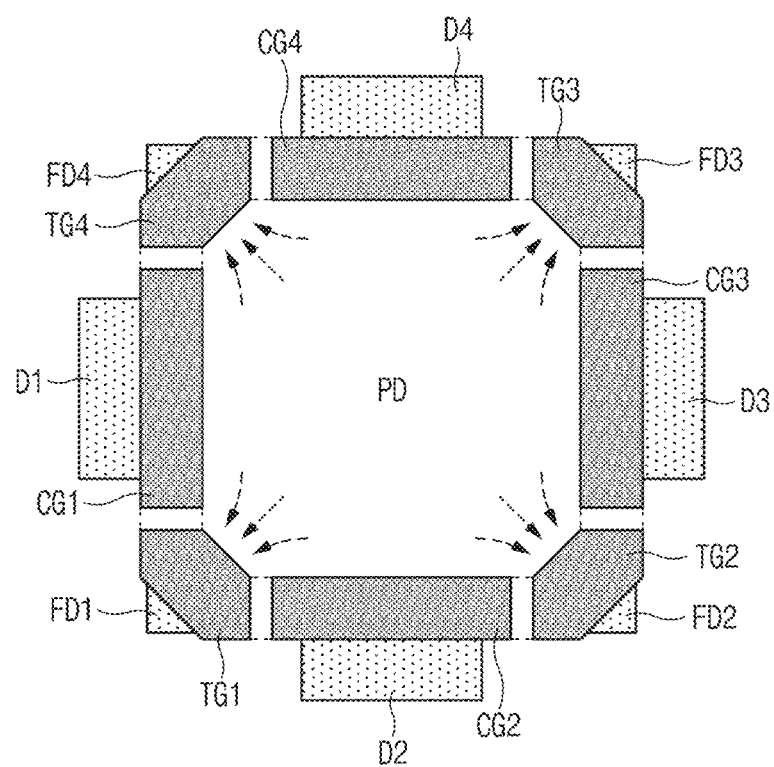
FIG. 6B is a conceptual diagram illustrating an example of appearance of the unit pixel shown in FIG. 2 in which electrons are transferred to a floating diffusion regions by transfer gates based on some implementations of the disclosed technology.

FIG. 6B is a conceptual diagram illustrating an example of the unit pixel shown in FIG. 2 in which electrons are transferred to the floating diffusion regions FDs by transfer gates based on some implementations of the disclosed technology.

Referring to FIG. 6B, when the transfer control signals TFv1 to TFv4 are applied to the transfer gates TG1 to TG4, a channel for electrically coupling the photoelectric conversion element PD to the floating diffusion regions FD1 to FD4 may be formed in the semiconductor substrate 10 disposed below the transfer gates TG1 to TG4, such that electrons of the photoelectric conversion element PD can be transferred to the floating diffusion regions FD1 to FD4.

The transfer control signals TFv1 to TFv4 may be sequentially applied to the transfer gates TG1 to TG4 in a predetermined direction (e.g., in a counterclockwise direction), without being simultaneously applied to the transfer gates TG1 to TG4. The transfer control signals TFv1 to TFv4 may be sequentially applied to the transfer gates TG1 to TG4 according to the order of operations of the circulation gates CG1 to CG4 shown in FIG. 4A.

For example, in a situation in which electrons collected in the peripheral region of the circulation gate CG1 by activation of the circulation gate CG1 move toward the circulation gate CG2, the transfer control signal (TFv1) can be applied only to the transfer gate TG1 located between the circulation gates CG1 and CG2. In this case, the transfer control signal (TFv1) may be higher in potential than each of the circulation control signals Vcir1 and Vcir2.

As described above, in the arrangement structure in which the transfer gate TG1 and the circulation gates CG1 and CG2 are arranged in an L-shape structure, in a situation in which the transfer gate TG1 is located at a vertex position and the signal (TFv1) applied to the transfer gate TG1 is higher in potential than each of the signals Vcir1 and Vcir2 applied to the circulation gates CG1 and CG2, most of electrons collected by the circulation gates CG1 and CG2 and the transfer gate TG1 may be intensively collected in the region located close to the transfer gate TG1. Thus, most of the collected electrons may be concentrated in a narrow region. Therefore, even when the transfer gate TG1 having a relatively small size is used, electrons can be rapidly transferred to the floating diffusion region FD1.

In the same manner as described above, in a situation in which electrons collected in the peripheral region of the circulation gate CG2 move toward the circulation gate CG3, the transfer control signal (TFv2) can be applied only to the transfer gate TG2 located between the circulation gates CG2 and CG3. In addition, if electrons collected in the peripheral region of the circulation gate CG3 move toward the circulation gate CG4, the transfer control signal (TFv3) can be applied only to the transfer gate TG3 located between the circulation gates CG3 and CG4. Likewise, if electrons collected in the peripheral region of the circulation gate CG4 move toward the circulation gate CG1, the transfer control signal (TFv4) can be applied only to the transfer gate TG4 located between the circulation gates CG4 and CG1.

Figure 7:
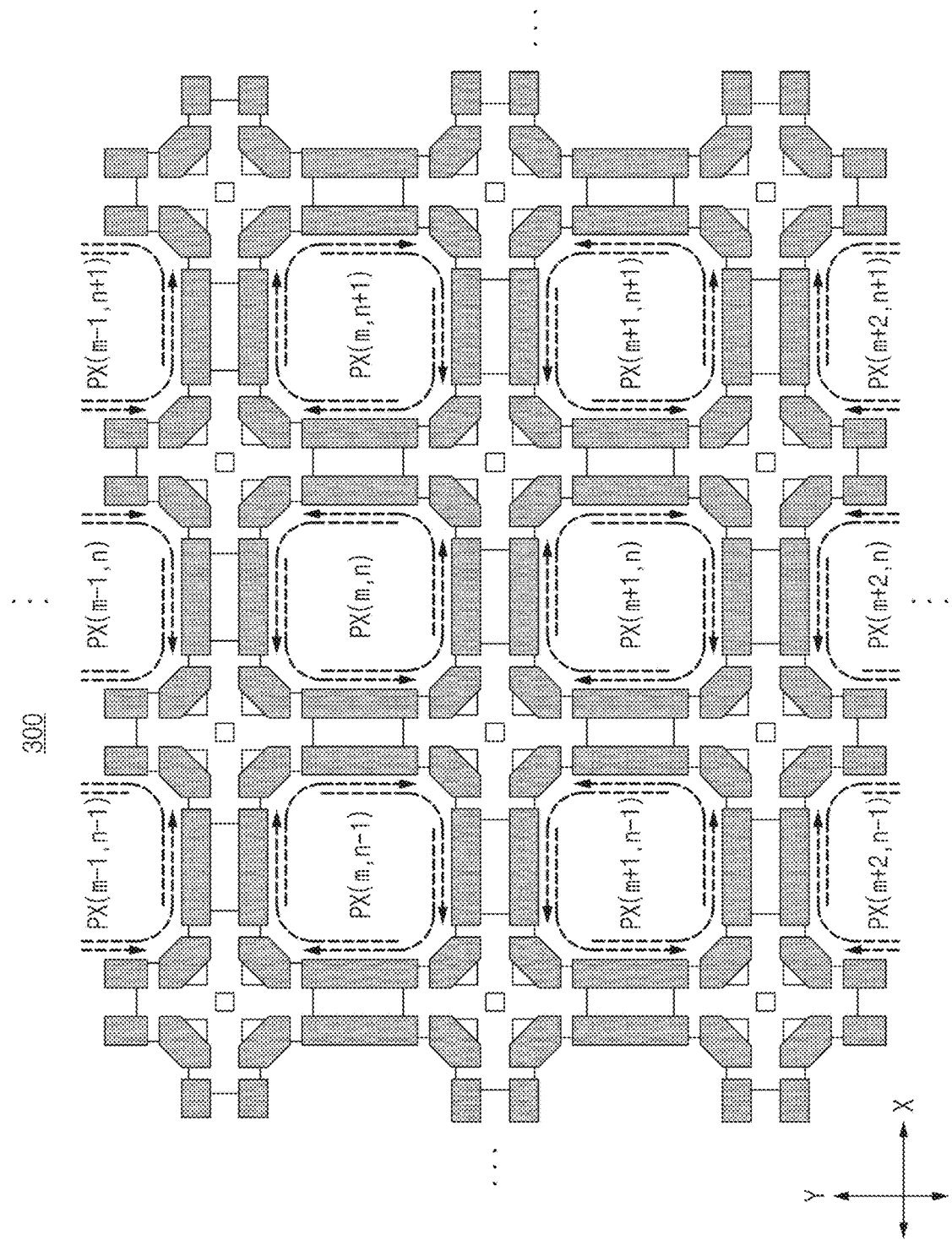
FIG. 7 is a conceptual diagram illustrating an example of the principles in which electrons are moving in contiguous unit pixels for use in the pixel array structure shown in FIG. 3 based on some implementations of the disclosed technology.

FIG. 7 is a conceptual diagram illustrating an example of the principles in which electrons are moving in contiguous or adjacent unit pixels for use in the pixel array structure shown in FIG. 3 based on some implementations of the disclosed technology.

Referring to FIG. 7, in the pixel array 300, electrons contained in the unit pixels contiguous or adjacent to each other in the first and second directions may move in opposite directions, and electrons contained in the unit pixels contiguous or adjacent to each other in a third or fourth direction (i.e., in a diagonal direction) may move in the same direction.

In the pixel array 300, electrons of all unit pixels may not move in the same direction, and electrons of the unit pixels contiguous or adjacent to each other in the first and second directions may move in opposite directions. In more detail, in association with the contiguous or adjacent unit pixels, the input orders of circulation control signals applied to the circulation gates of the corresponding unit pixels may be controlled in reverse, such that electrons of the unit pixels contiguous or adjacent to each other in the first and second directions may move in opposite directions in the pixel array 300.

For example, circulation control signals may be sequentially applied to the circulation gates of the unit pixels PX(m,n) and PX(m+1,n+1) in a counterclockwise direction, and circulation control signals may be sequentially applied to the circulation gates of the unit pixels PX(m,n+1) and PX(m+1,n) in a clockwise direction. The circulation control signals may be controlled by the modulation driver 440 to apply the circulation control signals to the unit pixels in a controlled direction.

In this case, the circulation gates formed to share the same common drain node CD may simultaneously receive circulation control signals. Thus, the circulation gates formed to share the same common drain node CD may operate at the same time.

As a result, in four unit pixels (i.e., a unit pixel group) contained in a (2×2) matrix structure, electrons of each unit pixel may move toward a center part of the corresponding unit pixel group, and such electrons may simultaneously move in four transfer gates collected in the center part of the corresponding unit pixel group.

In this case, four transfer gates arranged contiguous or adjacent to each other at the center part of each unit pixel group may simultaneously receive transfer control signals. Thus, the four transfer gates contiguous or adjacent to each other in the center part of each unit pixel group may operate at the same time, such that electrons of the corresponding unit pixel can be simultaneously transferred to the corresponding floating diffusion region FD.

As described above, electrons may move toward the same position (e.g., a center part of the unit pixel group) in the contiguous or adjacent unit pixels, and electrons of the unit pixel group may simultaneously move in the center part of the unit pixel group, such that movement and transmission (Tx) efficiency of such electrons can be improved.

Figure 8:
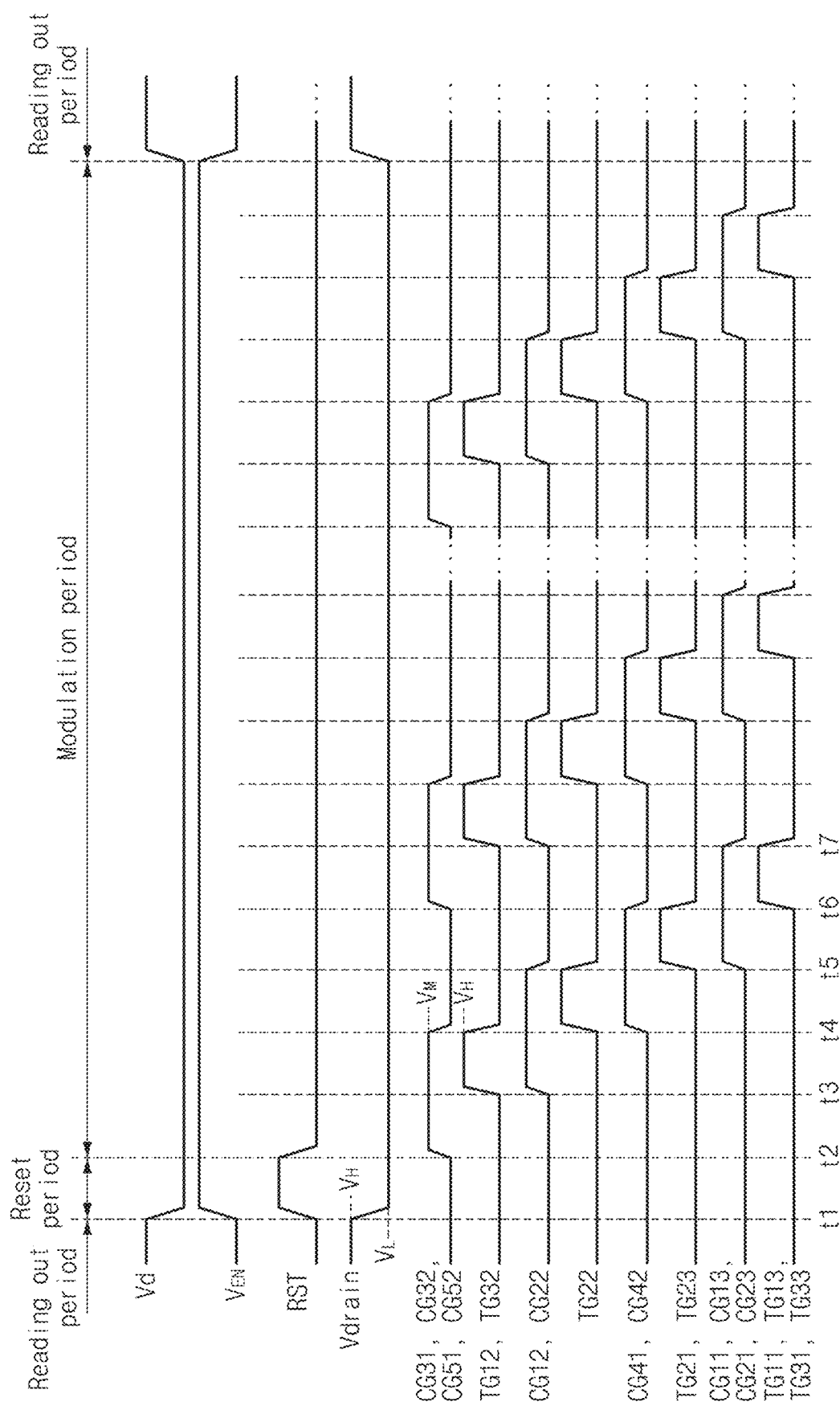
FIG. 8 is a timing diagram illustrating operations of the pixel array shown in FIG. 3 based on some implementations of the disclosed technology.

FIG. 8 is a timing diagram illustrating operations of the pixel array shown in FIG. 3 based on some implementations of the disclosed technology. FIGS. 9A to 9H are schematic diagrams illustrating operations of the unit pixels configured to operate in steps shown in FIG. 8 based on some implementations of the disclosed technology.

The following description will hereinafter be given by focusing the operations of one of the unit pixel groups for convenience of description. For example, the operations of the unit pixel group in which four unit pixels (each of which includes photoelectric conversion elements PX11 to PX22) are arranged in a (2×2) matrix structure will be discussed.

As described above, circulation gates sharing the same common drain node CD may operate at the same time. Thus, the same reference numbers may be allocated to the corresponding circulation gates, and the corresponding circulation gates having the same reference numbers may be considered a single circulation gate for convenience of description. The circulation gates sharing the common drain node CD may simultaneously receive the same control signal (i.e., the same circulation control signal), such that the circulation gates can operate at the same time.

Four transfer gates located at the center part of each unit pixel group can operate at the same time. Thus, the same reference numbers may be allocated to the corresponding transfer gates, and the corresponding transfer gates having the same reference numbers may be considered a single transfer gate for convenience of description. Four transfer gates located at the center part of each unit pixel group may simultaneously receive the same control signal (e.g., the same transfer control signal).

In a time period t1 to t7 shown in FIG. 8, the timing points may be arranged at intervals of the same period. In FIG. 8, waveforms of signals corresponding to the circulation gates may denote waveforms of circulation control signals applied to the corresponding gates, or waveforms of signals corresponding to the transfer gates may denote waveforms of transfer control signals applied to the transfer gates.

Figure 9A:
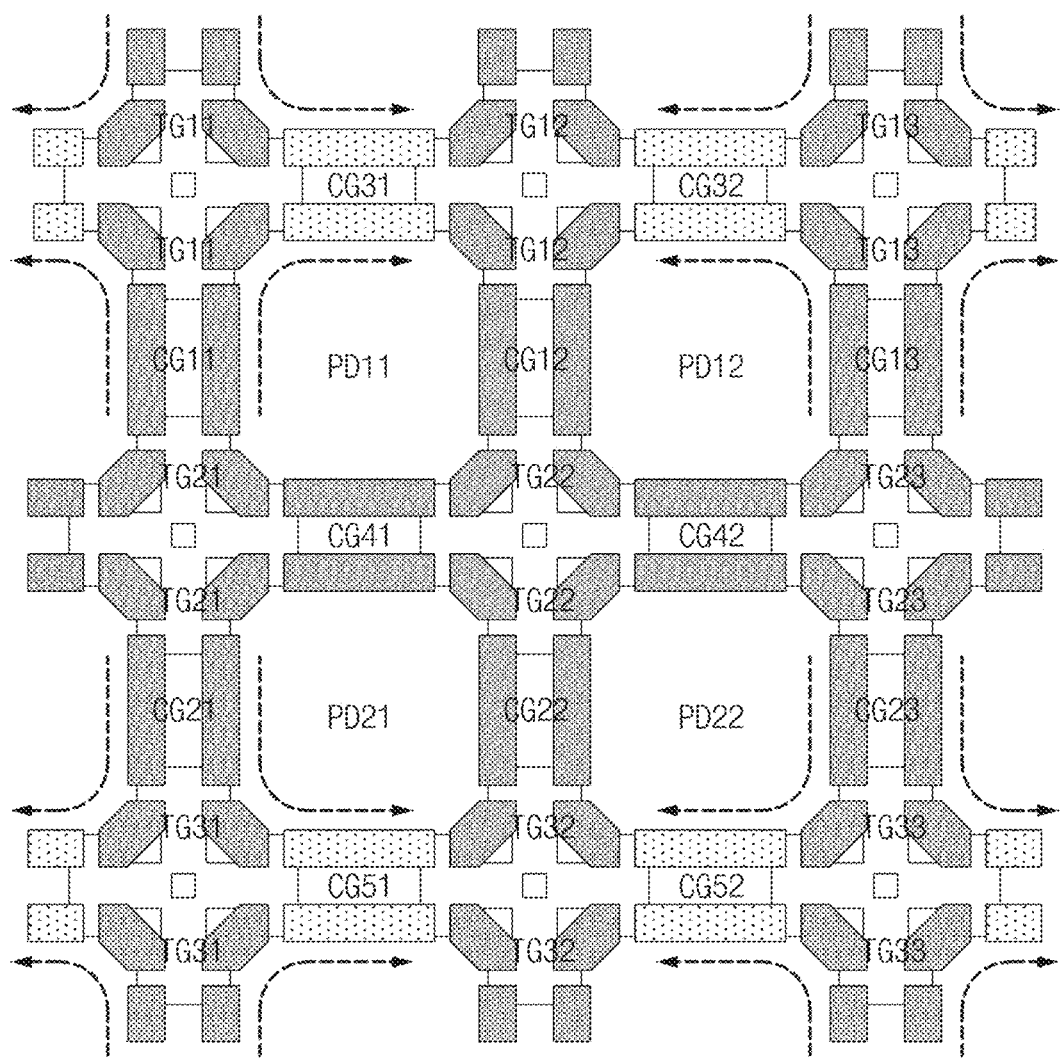
FIGS. 9A to 9H are schematic diagrams illustrating operations of the pixel array configured to operate in steps shown in FIG. 8 based on some implementations of the disclosed technology.

Referring to FIGS. 8 and 9A, an enable signal ($V_{EN}$) and a reset signal RST may be activated to a high level at a timing point (t1). The reset signal RST may be deactivated to a low level at a timing point (t2). Thus, prior to beginning of the modulation period in which electrons move and transfer, the unit pixels may be initialized for a time period t1 to t2.

If the reset signal RST is deactivated to a low level at the timing point (t2), the modulation period for moving and transferring electrons may be started. After the modulation period is ended, the read-out period starts for reading out the tap signals TAP1 to TAP4 corresponding to the amount of charges of electrons having been transmitted to the floating diffusion regions FD1 to FD4 during the modulation period.

The drain voltage (Vd) applied to drain nodes of the unit pixels may be at a low-voltage (e.g., a ground voltage) level at the timing point (t1). In each of the reset period and the modulation period, the drain voltage (Vd) may be at a low-voltage level. In the read-out period, the drain voltage (Vd) may be at a high-voltage (e.g., a power-supply voltage) level.

For example, the drain voltage (Vd) may be at a low-voltage level in the modulation period. This is because the drain voltage (Vd) having a high-voltage during the modulation period can prevent electrons collected by the circulation gate from moving toward the transfer gate.

In each of the reset period and the modulation period, the draining control signal (Vdrain) for fixing the photoelectric conversion element PD to the drain voltage (Vd) may also be at a low-voltage ($V_L$) level. In the read-out period, the draining control signal (Vdrain) for fixing the photoelectric conversion element PD to the drain voltage (Vd) may be at a high-voltage ($V_H$) level. In this case, the high-voltage ($V_H$) level of the draining control signal (Vdrain) may denote a voltage level by which a channel is formed in the semiconductor substrate disposed below the corresponding circulation gate.

The circulation control signals applied to the circulation gates CG31, CG32, CG51, and CG52 may be activated at the timing point (t2) at which the reset period is ended. In this case, each of the circulation control signals applied to the circulation gates CG31, CG32, CG51, and CG52 may have an electric potential ($V_M$) by which the corresponding common drain node CD is not electrically coupled to the photoelectric conversion element PD. The corresponding circulation control signals may be activated for a predetermined time t2 to t4.

Since the circulation control signals are applied to the circulation gates CG31, CG32, CG51, and CG52, the electric field (E-field) may be formed in the peripheral region of the corresponding circulation gates CG31, CG32, CG51, and CG52. Therefore, electrons formed by photoelectric conversion of reflected light in the photoelectric conversion elements PD11 to PD22 may move toward the corresponding circulation gates CG31, CG32, CG51, and CG52, such that the electrons can be collected around the circulation gates CG31, CG32, CG51, and CG52.

In this case, each of the circulation gates CG31, CG32, CG51, and CF52 may be arranged in a manner that two circulation gates are located contiguous to each other based on the common drain node CD interposed therebetween. Thus, two contiguous circulation gates forming each of the circulation gates CG31, CG32, CG51, and CF52 may be arranged to simultaneously operate and electrons can more easily move.

In some implementations, the movement directions of electrons in the photoelectric conversion elements PD11 to PD22 of the unit pixel group may be arranged symmetrical to each other, such that the electrons can be uniformly distributed in the pixel array 300.

Figure 9B:
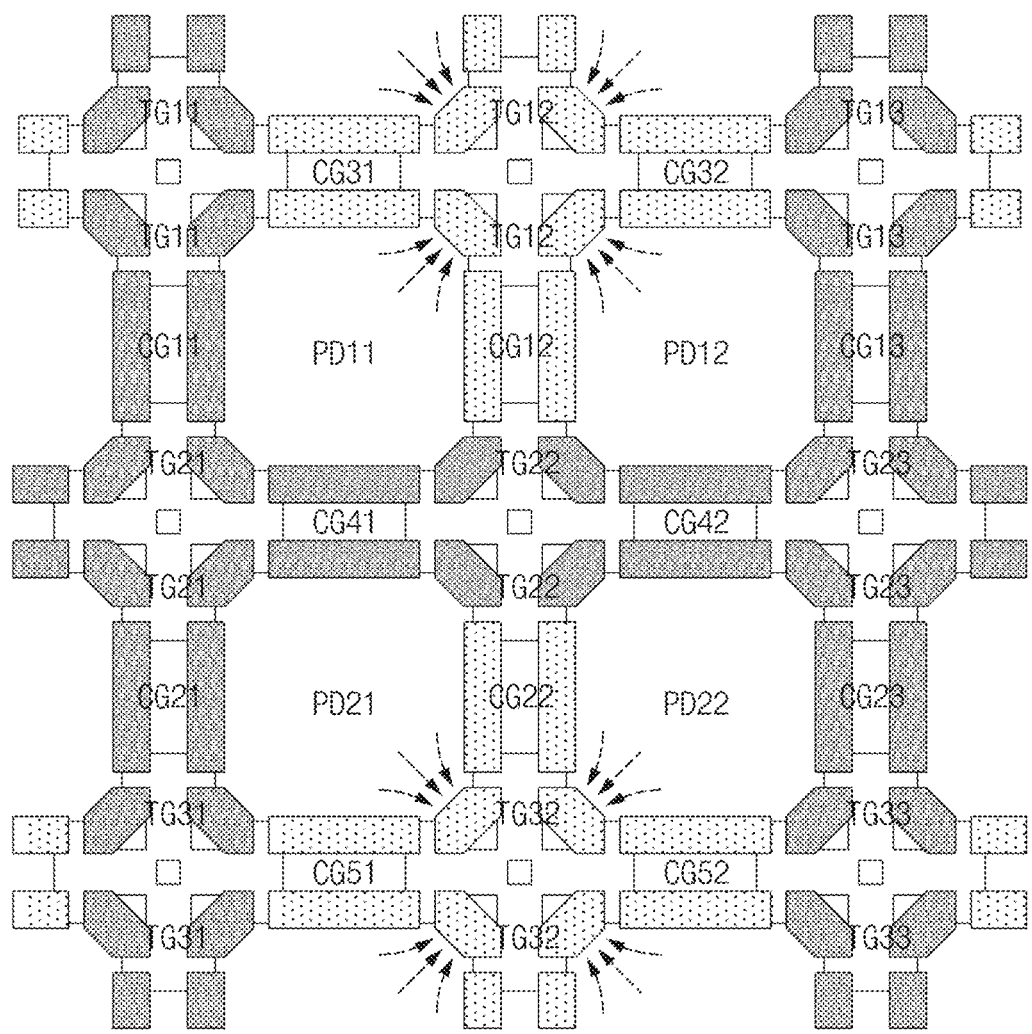

Referring to FIGS. 8 and 9B, after lapse of a predetermined time from the expiration of the timing point (t2), transfer control signals applied to the transfer gates TG12 and TG32 and circulation control signals applied to the circulation gates CG12 and CG22 may be activated at the timing point (t3). For example, in a situation in which the circulation gates CG31, CG32, CG51, and CG52 are still operated, the circulation gates CG12 and CG22 and the transfer gates TG12 and TG32 may operate at the same time. In this case, the transfer control signals applied to the transfer gates TG12 and TG32 may have a higher potential ($V_H$) than each of the circulation control signals, as represented by "$V_M<V_H$".

The transfer control signals applied to the transfer gates TG12 and TG32 may be activated for a predetermined time t3 to t4, and the circulation control signals applied to the circulation gates CG12 and CG22 may be activated for a predetermined time t3 to t5.

Therefore, electrons, that have been collected in the peripheral region of the circulation gates CG31 and CG32 during the time period t2 to t3, may move toward the transfer gate TG12. In addition, electrons, that have been additionally collected by the circulation gate CG12 and the transfer gate TG12 during the time period t3 to t4, may also move toward the transfer gate TG12.

Electrons, that have been collected in the peripheral region of the circulation gates CG51 and CG52 during the time period t2 to t3, may move toward the transfer gate TG32. In addition, electrons, that have been additionally collected by the circulation gate CG22 and the transfer gate TG32 during the time period t3 to t4, may also move toward the transfer gate TG32.

The circulation gates CG31 and CG12 and the transfer gate TG12 are arranged in an L-shape structure, the transfer gate TG12 is arranged at a vertex position between the circulation gates CG31 and CG12 and a relatively higher potential is applied to the transfer gate TG12, such that electrons generated by the photoelectric conversion element PD11 can be intensively collected in the region (e.g., the vertex region) located close to the transfer gate TG12.

In addition, electrons generated by the photoelectric conversion element PD12 can be intensively collected in the region (i.e., the vertex region) located close to the transfer gate TG12 by the circulation gates CG32 and CG12 and the transfer gate TG12.

Likewise, electrons generated by the photoelectric conversion element PD21 can be intensively collected in the region (e.g., the vertex region) located close to the transfer gate TG32 by the circulation gates CG51 and CG22 and the transfer gate TG32, and electrons generated by the photoelectric conversion element PD22 can be intensively collected in the region (e.g., the vertex region) located close to the transfer gate TG32 by the circulation gates CG52 and CG22 and the transfer gate TG32. From the viewpoint of four contiguous unit pixels included in the unit pixel group, electrons can be collected in the center part of each unit pixel group.

The collected electrons may be simultaneously transmitted to the corresponding floating diffusion regions FDs by the transfer gates TG12 and TG32. That is, in each unit pixel, electrons may be intensively collected in a narrow vertex region, such that electrons can be rapidly transmitted to the floating diffusion regions FDs using a small-sized transfer gate.

Figure 9C:
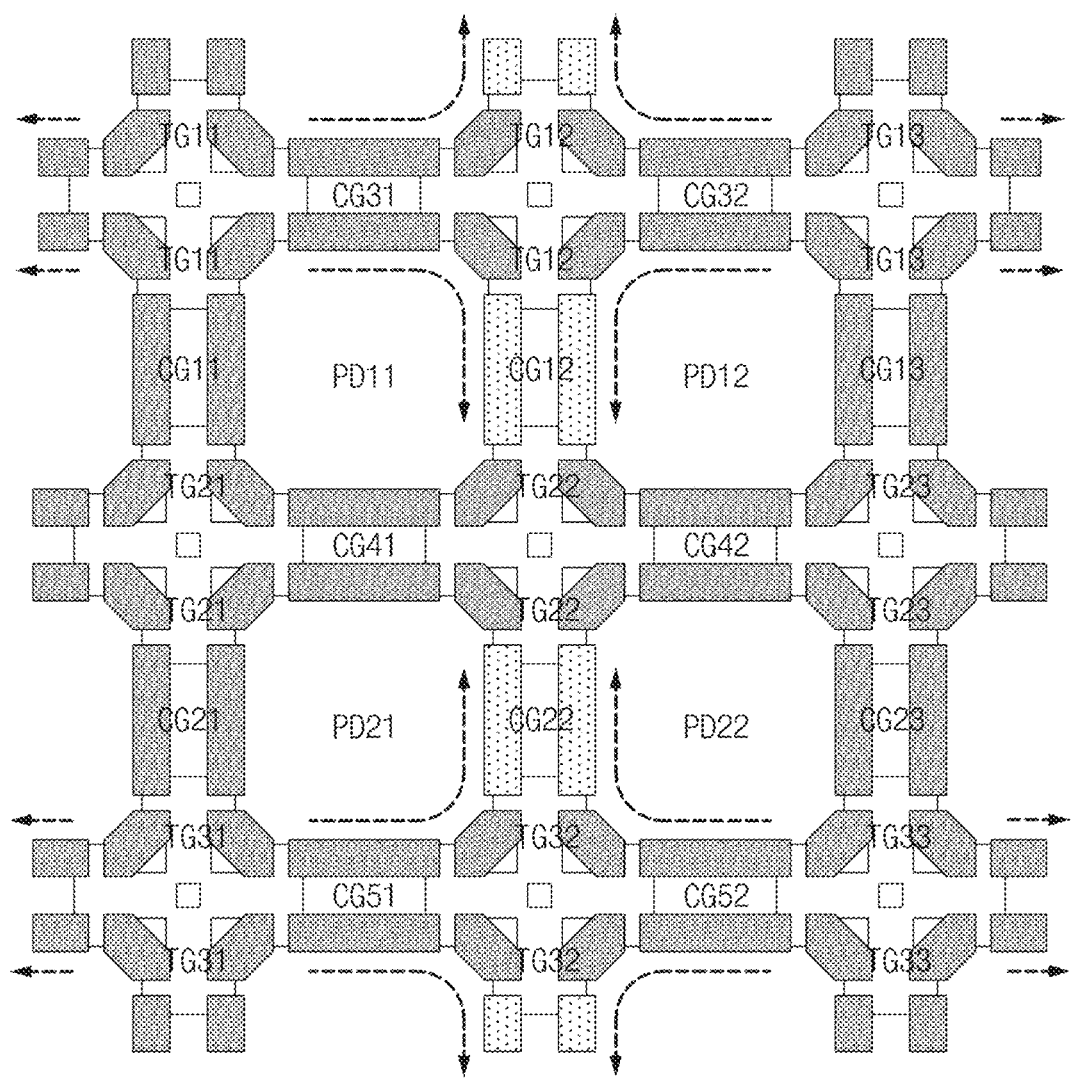
Figure 9D:
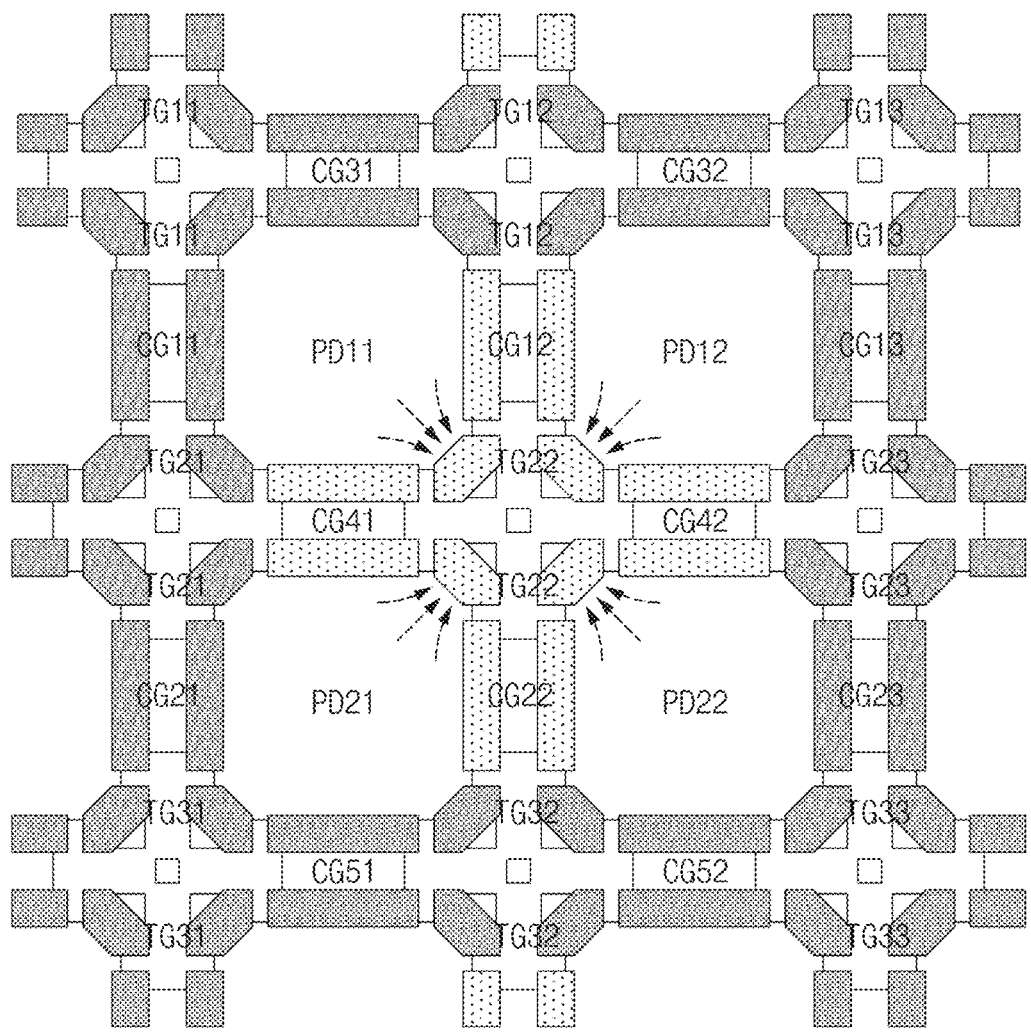

Referring to FIGS. 8, 9C and 9D, at the timing point (t4), the circulation control signals applied to the circulation gates CG31, CG32, CG51, and CG52 and the transfer control signals applied to the transfer gates TG12 and TG32 may be deactivated, and the transfer control signal applied to the transfer gate TG22 and the circulation control signals applied to the circulation gates CG41 and CG42 may be activated. That is, in a situation in which the circulation gates CG12 and CG22 having received the circulation control signals at the timing point (t3) are still operated, the circulation gates CG31, CG32, CG51, and CG52 and the transfer gates TG12 and TG32 may stop operation, and the transfer gate TG22 and the circulation gates CG41 and CG42 may start operation. In this case, the transfer control signal may have a higher potential ($V_H$) than the circulation control signal.

Although the transfer control signals and the circulation control signals are activated, a predetermined time (i.e., a rising time) may be needed until potential levels of signals reach a predetermined level at which the gates TG22, CG41, and CG42 can actually operate. Thus, there exists a time period in which the transfer gate TG22 is not yet operated while the transfer gates TG12 and TG32 stop their operations.

Therefore, the circulation gates CG12 and CG22 are continuously activated until reaching the timing point (t5). As a result, during the time period in which the transfer gate TG22 is not yet operated, electrons may not be dispersed and move toward the circulation gates CG12 and CG22. For example, not only electrons not transmitted by the transfer gates TG12 and TG32, but also newly generated electrons may move toward the circulation gates CG12 and CG22 as shown in FIG. 9C.

If the rising time of each of the control signals applied to the transfer gate TG22 and the circulation gates CG41 and CG42 has expired, the transfer gate TG22 and the circulation gates CG41 and CG42 may operate as shown in FIG. 9D. That is, the transfer gate TG22 and the circulation gates CG12, CG22, CG41, and CG42 located in the peripheral region of the transfer gate TG22 may operate at the same time.

In this case, since the potential ($V_H$) of the transfer control signal is higher than the potential ($V_M$) of each of the circulation control signals, electrons may move toward the transfer gate TG22 and may flow into the floating diffusion regions by the transfer gate TG22, as shown in FIG. 9D. In other words, electrons generated by each of the photoelectric conversion elements PD11 to PD22 are intensively collected in the center part of the corresponding unit pixel group, and are then transmitted to the floating diffusion regions by the transfer gate TG22.

Figure 9E:
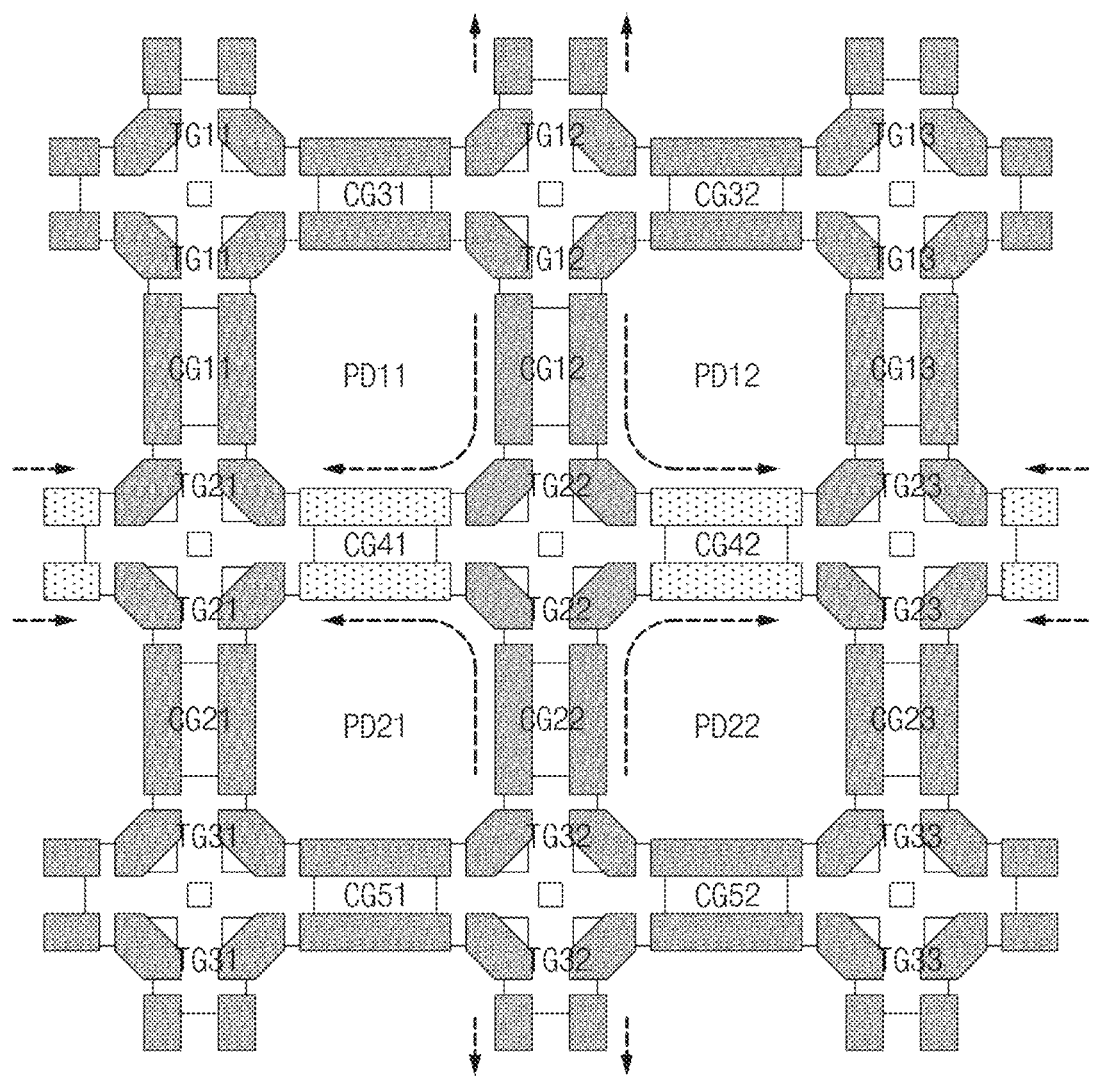
Figure 9F:
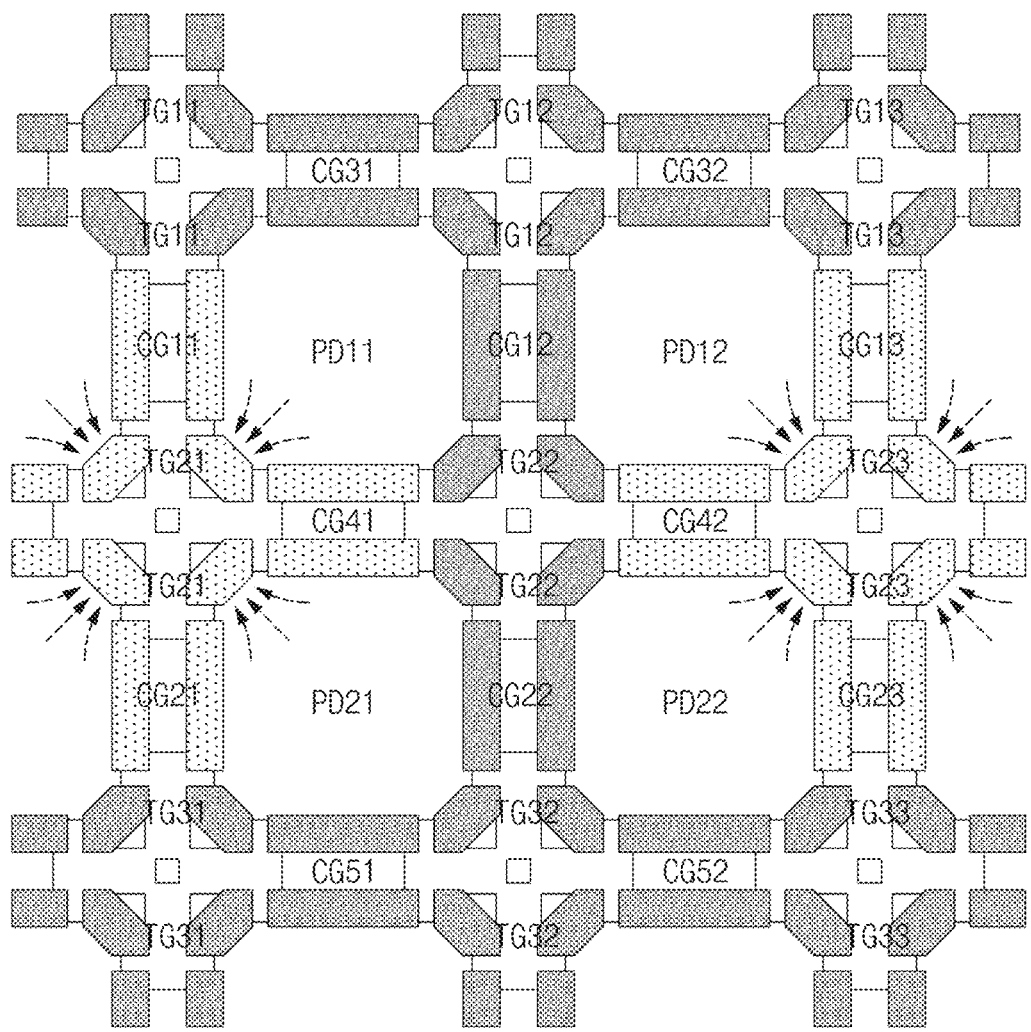

Referring to FIGS. 8, 9E and 9F, at the timing point (t5), the circulation control signals applied to the circulation gates CG12 and CG22 and the transfer control signal applied to the transfer gate TG22 may be deactivated, and the transfer control signals applied to the transfer gates TG21 and TG23 and the circulation control signals applied to the circulation gates CG11, CG13, CG21, and CG23 may be activated. That is, in a situation in which the circulation gates CG41 and CG42 having received the circulation control signals at the timing point (t4) are still operated, the circulation gates CG12 and CG22 and the transfer gate TG22 may stop operation, and the transfer gates TG21 and TG23 and the circulation gates CG11, CG13, CG21, and CG23 may start operation. In this case, the transfer control signal may have a higher potential ($V_H$) than the circulation control signal.

In this case, the circulation gates CG41 and CG42 are continuously activated until reaching the timing point (t6). As a result, during a predetermined time in which the transfer gates TG21 and TG23 are not yet operated, electrons may not be dispersed and move toward the circulation gates CG41 and CG42 as shown in FIG. 9E.

If the rising time of each of the control signals applied to the transfer gates TG21 and TG23 and the circulation gates CG11, CG13, CG21 and CG23 has expired, the transfer gates TG21 and TG23 and the circulation gates CG11, CG13, CG21, and CG23 may operate as shown in FIG. 9F. That is, the transfer gates TG21 and TG23 and the circulation gates CG11, CG21, CG41, CG13, CG23, and CG42 located in the peripheral region of the transfer gates TG21 and TG23 may operate at the same time.

In this case, since the potential ($V_H$) of the transfer control signal is higher than the potential ($V_M$) of each of the circulation control signals, electrons move toward the transfer gates TG21 and TG23 and then flow into the floating diffusion regions by the transfer gates TG21 and TG23.

Figure 9G:
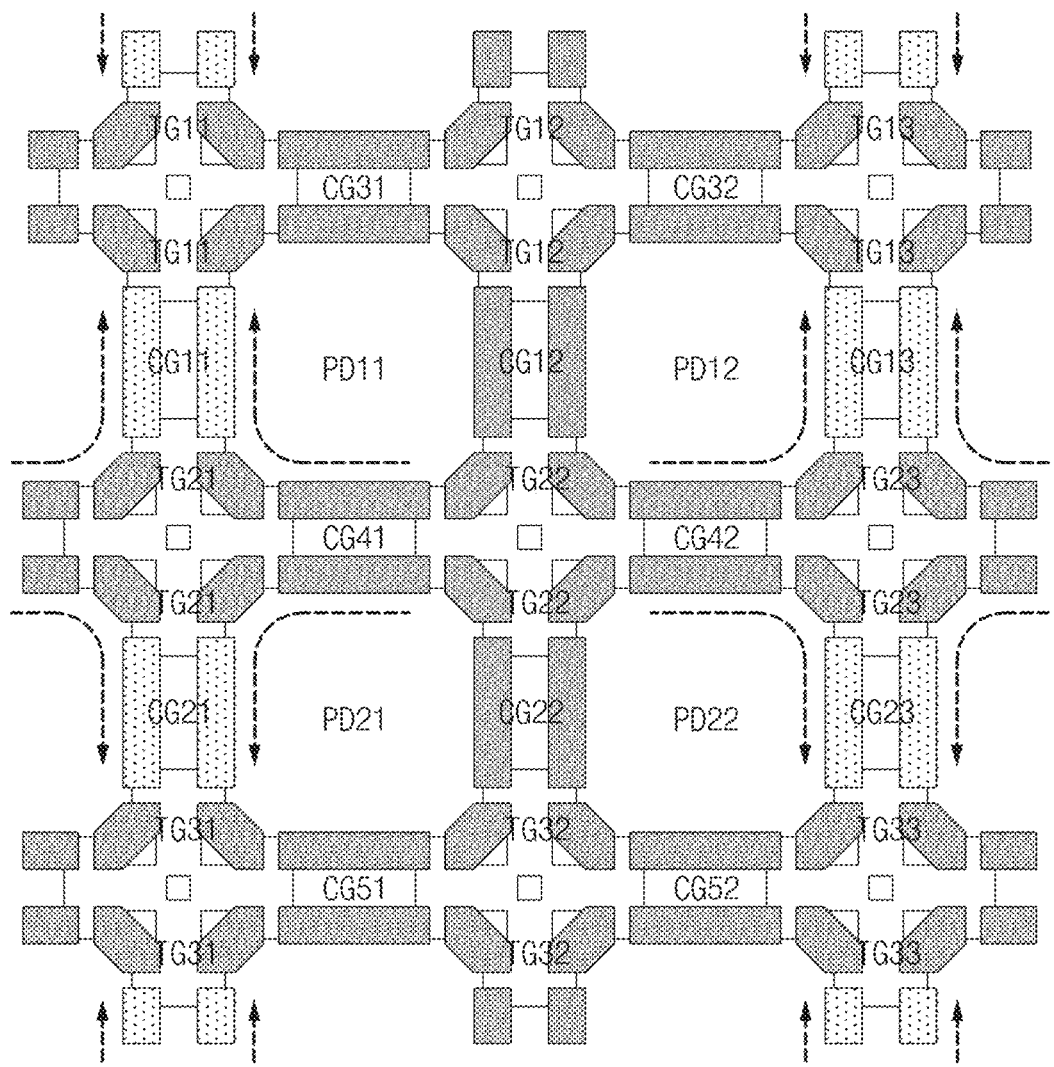
Figure 9H:
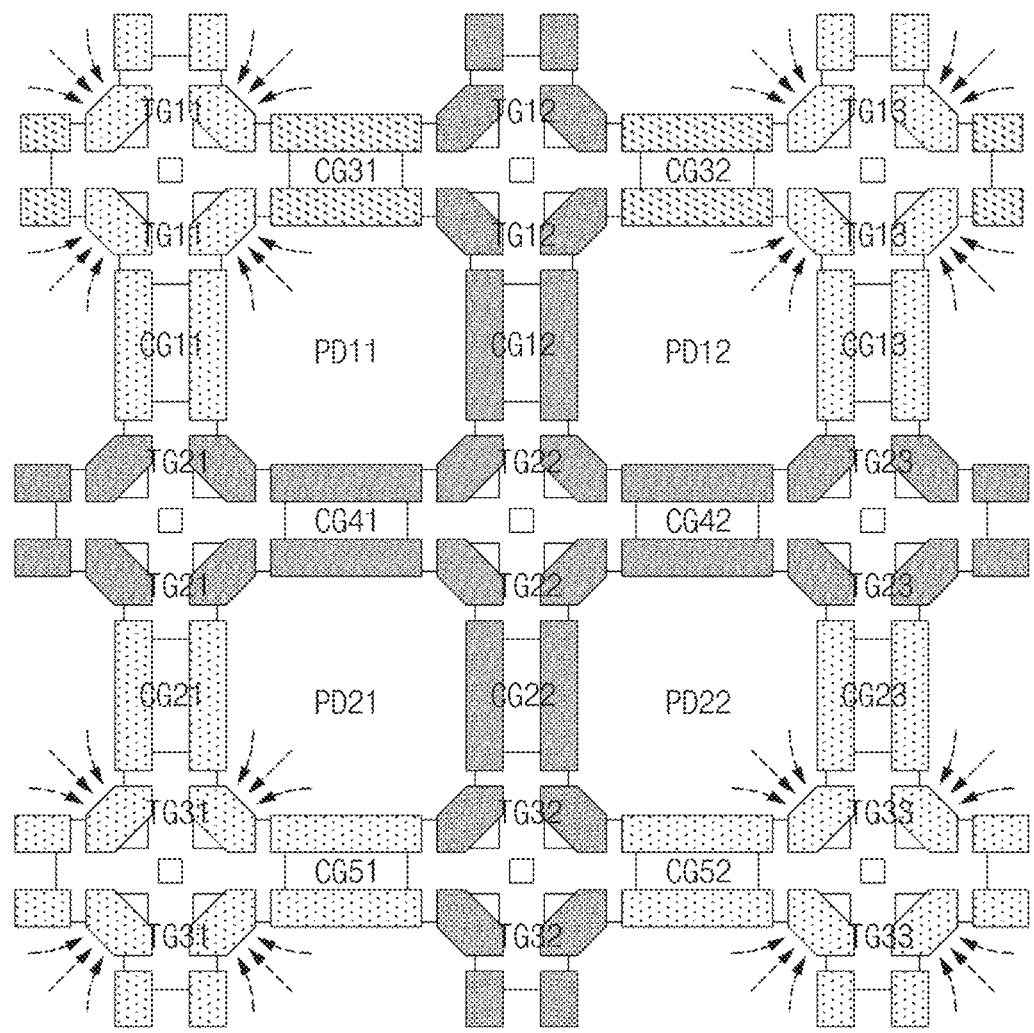

Referring to FIGS. 8, 9G and 9H, the circulation control signals applied to the circulation gates CG41 and CG42 and the transfer control signals applied to the transfer gates TG21 and TG23 may be deactivated at the timing point (t6), and the transfer control signals applied to the transfer gates TG11, TG13, TG31, and TG33 and the circulation control signals applied to the circulation gates CG31, CG32, CG51, and CG52 may be activated at the timing point (t6). In this case, each of the transfer control signals may have a higher potential ($V_H$) than each of the circulation control signals, and the circulation control signals applied to the circulation gates CG11, CG13, CG21, and CG23 may remain activated until reaching the timing point (t7).

Therefore, as shown in FIG. 9G, electrons generated by the photoelectric conversion elements PD11 to PD22 may move toward the circulation gates CG11, CG13, CG21, and CG23. Thereafter, if the rising time of each of the control signals applied to the transfer gates TG11, TG13, TG31, and TG33 and the circulation gates CG31, CG32, CG51, and CG52 has expired, electrons may flow into the floating diffusion regions by the transfer gates TG11, TG13, TG31, and TG33 as shown in FIG. 9H.

Until the modulation period has expired after lapse of the timing point (t7), movement of electrons in the time period t3 to t7 and sequential transmission of such moved electrons flowing into the floating diffusion regions may be repeatedly performed. That is, during the modulation period, the circulation control signals applied to the circulation gates of each unit pixel PX and the transfer control signals applied to the transfer gates of each unit pixel PX can be repeatedly circulated and changed in a counterclockwise or clockwise direction.

If the modulation period has expired, the enable signal ($V_{EN}$) is deactivated such that the read-out period may be started. In this case, the drain voltage (Vd) may be at a high-voltage ($V_H$) level, and the draining control signal (Vdrain) may be activated to a high-voltage ($V_H$) level.

Therefore, the photoelectric conversion elements PD11 to PD22 may be electrically coupled to the common drain nodes CDs by the circulation gates located at four sides of the corresponding photoelectric conversion elements PD11 to PD22, such that the photoelectric conversion elements PD11 to PD22 may be fixed to the drain voltage (Vd) during the read-out period.

As is apparent from the above description, an image sensing device based on the disclosed technology can be implemented in ways that improve operational characteristics of the device.

Those skilled in the art will appreciate that the embodiments may be carried out in other specific ways than those set forth herein in light of the disclosure.

Although a number of illustrative embodiments have been described, it should be understood that numerous other modifications and embodiments can be devised based on this disclosure.

What is claimed is:

1. An image sensing device comprising:
a pixel array including a plurality of unit pixels arranged in columns and rows,
wherein each of the plurality of unit pixels includes:
a photoelectric conversion element configured to perform a photoelectric conversion in response to incident light and generate photocharges corresponding to the incident light;
circulation gates located at sides of the photoelectric conversion element and configured to receive circulation control signals and move the photocharges within the photoelectric conversion element in a predetermined direction based on the circulation control signals;
transfer gates, each located between two adjacent circulation gates and configured to receive a transfer control signal and transmit the photocharges to a floating diffusion region based on the transfer control signal; and
drain nodes located at sides of the circulation gates that are opposite to the photoelectric conversion element, and configured to receive a drain voltage,
wherein the drain nodes include a first drain node that is shared by two adjacent unit pixels arranged in a first direction and a second drain node that is shared by the two adjacent unit pixels arranged in a second direction perpendicular to the first direction.

2. The image sensing device according to claim 1, wherein:
the circulation gates are configured to generate an electric field in the photoelectric conversion element and move the photocharges using the electric field.

3. The image sensing device according to claim 1, wherein:
the first drain node is disposed between circulation gates of two adjacent unit pixels arranged in the first direction and the second drain node is disposed between circulation gates of two adjacent unit pixels arranged in the second direction.

4. The image sensing device according to claim 1, wherein:
the circulation gates sharing the first drain node are simultaneously operated and the circulation gates sharing the second drain node are simultaneously operated.

5. The image sensing device according to claim 1, wherein:
the circulation gates are configured to electrically couple the drain nodes to the photoelectric conversion element based on a draining control signal.

6. The image sensing device according to claim 1, wherein:
the circulation gates and the transfer gates are alternately arranged and are configured to surround the photoelectric conversion element.

7. The image sensing device according to claim 1, wherein the pixel array includes:
a first unit pixel;
a second unit pixel located adjacent to the first unit pixel in the first direction;
a third unit pixel located adjacent to the first unit pixel in the second direction; and a fourth unit pixel located adjacent to the third unit pixel in the first direction,
wherein circulation gates of the first unit pixel are configured to sequentially receive circulation control signals in a clockwise direction; and
circulation gates of the second unit pixel and the third unit pixel are configured to sequentially receive circulation control signals in a counterclockwise direction.

8. The image sensing device according to claim 7, wherein:
circulation gates of the fourth unit pixel are configured to sequentially receive the circulation control signals in the clockwise direction.

9. The image sensing device according to claim 7, wherein:
four transfer gates that are included in the first to fourth unit pixels, respectively, and located adjacent to one another are configured to receive transfer control signals at the same time.

10. An image sensing device comprising:
a plurality of photoelectric conversion elements configured to generate photocharges corresponding to incident light through photoelectric conversion of the incident light, and arranged such that the photoelectric conversion elements are spaced apart from one another by a predetermined distance in a first direction and a second direction perpendicular to the first direction;
a plurality of common drain nodes located between two adjacent photoelectric conversion elements that are arranged in the first direction or the second direction;
a plurality of circulation gates, each located between one of the common drain nodes and one of the photoelectric conversion elements; and
a plurality of transfer gates located at corners of each of the photoelectric conversion elements in a third direction and a fourth direction perpendicular to the third direction.

11. The image sensing device according to claim 10, wherein:
the plurality of circulation gates and the plurality of transfer gates are located to partially overlap with the photoelectric conversion elements.

12. The image sensing device according to claim 10, wherein:
each of the plurality of circulation gates and each of the plurality of transfer gates are arranged alternately with each other and are configured to surround a corresponding photoelectric conversion element.

13. The image sensing device according to claim 12, wherein:
some of the plurality of circulation gates is located at four sides of a corresponding photoelectric conversion element.

14. The image sensing device according to claim 10, further comprising:
a well pickup region located around a center of a rectangular shaped defined by four adjacent photoelectric conversion elements and configured to receive a bias voltage,
wherein transfer gates located adjacent to the well pickup region in the third direction and the fourth direction are configured to operate simultaneously one another.

15. The image sensing device according to claim 10, wherein:
some of the circulation gates that are located at both sides of each common drain node and interposed between two adjacent photoelectric conversion elements are configured to operate simultaneously one another.

16. An image sensing device comprising:
a light source configured to emit light to a target object;
a pixel array including a plurality of unit pixels, each configured to generate a pixel signal by performing photoelectric conversion of incident light reflected from the target object; and
a control circuit in communication with the light source and the pixel array and configured to control operations of the light source and the unit pixels and obtain a time delay based on a distance to the target object,
wherein the control circuit is further configured to control the unit pixels such that (1) electrons generated in each of the unit pixels move in a clockwise or counterclockwise direction and (2) directions of moves of electrons in two adjacent unit pixels are opposite to each other.

17. The image sensing device according to claim 16, wherein each of the unit pixels includes:
a photoelectric conversion element configured to perform the photoelectric conversion in response to the incident light and generate the electrons;
a plurality of circulation gates configured to receive circulation control signals from the control circuit and move the electrons in a corresponding photoelectric conversion element; and
a plurality of transfer gates configured to receive transfer control signals from the control circuit and transmit the electrons moved by the circulation gates to floating diffusion regions.

18. The image sensing device according to claim 17, wherein:
the plurality of circulation gates is located at both sides of each photoelectric conversion element in a first direction and a second direction perpendicular to the first direction; and
each of the plurality of transfer gates is located between two adjacent circulation gates while being arranged alternately with one of the circulation gates.

19. The image sensing device according to claim 18, wherein the pixel array includes:
a first unit pixel;
a second unit pixel located contiguous to the first unit pixel in the first direction;
a third unit pixel located contiguous to the first unit pixel in the second direction; and
a fourth unit pixel located adjacent to the third unit pixel in the first direction,
wherein circulation gates of the first unit pixel are configured to sequentially receive the circulation control signals in a clockwise direction; and
circulation gates of the second unit pixel and the third unit pixel are configured to sequentially receive the circulation control signals in a counterclockwise direction.

20. The image sensing device according to claim 19, wherein:
the circulation gates of the fourth unit pixel are configured to sequentially receive the circulation control signals in the clockwise direction.

* * * * *